(12) United States Patent
Sawataishi et al.

(10) Patent No.: US 11,062,881 B2
(45) Date of Patent: Jul. 13, 2021

(54) PLASMA ETCHING METHOD AND PLASMA PROCESSING DEVICE

(71) Applicant: Tokyo Electron Limited, Tokyo (JP)

(72) Inventors: Masayuki Sawataishi, Miyagi (JP); Jun Hirose, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/977,856

(22) PCT Filed: Jul. 19, 2019

(86) PCT No.: PCT/JP2019/028542
§ 371 (c)(1),
(2) Date: Sep. 3, 2020

(87) PCT Pub. No.: WO2020/026861
PCT Pub. Date: Feb. 6, 2020

(65) Prior Publication Data
US 2021/0005427 A1    Jan. 7, 2021

(30) Foreign Application Priority Data
Aug. 2, 2018    (JP) .............................. JP2018-145816

(51) Int. Cl.
*H01J 37/32*    (2006.01)
*H01L 21/311*    (2006.01)
(Continued)

(52) U.S. Cl.
CPC .. *H01J 37/32082* (2013.01); *H01J 37/32642* (2013.01); *H01L 21/31116* (2013.01);
(Continued)

(58) Field of Classification Search
CPC .......... H01J 37/32082; H01J 37/32642; H01J 2237/334; H01L 21/31116; H01L 21/6833; H01L 21/68735
(Continued)

(56) References Cited

U.S. PATENT DOCUMENTS

2012/0285623 A1* 11/2012 Moriya ............. H01J 37/32431
156/345.47
2015/0138687 A1* 5/2015 Boyd, Jr. .......... H01L 21/67288
361/234
(Continued)

FOREIGN PATENT DOCUMENTS

JP    4-236449 A    8/1992
JP    6-120329 A    9/1994
(Continued)

*Primary Examiner* — Lan Vinh
(74) *Attorney, Agent, or Firm* — Nath, Goldberg & Meyer; Jerald L. Meyer; Tanya E. Harkins

(57) ABSTRACT

A plasma etching method according to an exemplary embodiment comprises arranging a substrate on an electrostatic chuck in a region surrounded by a focus ring. The substrate, in a state of being held by the electrostatic chuck, is etched by means of ions from a plasma. The electrostatic chuck includes a plurality of electrodes including a first electrode and a second electrode. The first electrode extends under a central region of the substrate. The second electrode extends under an edge region of the substrate. A plurality of voltages are respectively applied to the plurality of electrodes, wherein the plurality of voltages are determined such that, in the state in which the substrate is held by the electrostatic chuck, the ions from the plasma are incident on both the central region and the edge region substantially vertically.

19 Claims, 21 Drawing Sheets

(51) Int. Cl.
*H01L 21/683* (2006.01)
*H01L 21/687* (2006.01)

(52) U.S. Cl.
CPC .... *H01L 21/6833* (2013.01); *H01J 2237/334* (2013.01); *H01L 21/68735* (2013.01)

(58) Field of Classification Search
USPC ............... 438/706, 712, 714, 718, 717, 720; 156/345.14, 345.45, 345.47
See application file for complete search history.

(56) References Cited

U.S. PATENT DOCUMENTS

2015/0262794 A1* 9/2015 Kihara ................ H01J 37/3244
  216/71
2018/0122680 A1* 5/2018 Yang ................ H01L 21/67288

FOREIGN PATENT DOCUMENTS

| | | |
|---|---|---|
| JP | 7-211705 A | 8/1995 |
| JP | 2007-258417 A | 10/2007 |
| JP | 2011-35266 A | 2/2011 |
| JP | 2016-32096 A | 3/2016 |
| JP | 2017-120841 A | 7/2017 |

* cited by examiner

PLASMA ETCHING METHOD AND PLASMA PROCESSING DEVICE

This is a National Phase Application filed under 35 U.S.C. 371 as a national stage of PCT/JP2019/028542, filed Jul. 19, 2019, an application claiming the benefit of Japanese Application No. 2018-145816, filed Aug. 2, 2018, the content of each of which is hereby incorporated by reference in its entirety.

TECHNICAL FIELD

The exemplary embodiment of the present disclosure relates to a plasma etching method and a plasma processing device.

BACKGROUND

A plasma processing device is used in the manufacture of electronic devices. The plasma processing device has a chamber and a substrate support. The substrate support is disposed in the chamber. The substrate support has a lower electrode and an electrostatic chuck. A radio-frequency power source is electrically coupled to the lower electrode. The electrostatic chuck has a dielectric body and electrodes. The electrodes are located in the body. A direct current (DC) power source is electrically coupled to the electrodes of the electrostatic chuck. A focus ring is mounted on the substrate support. A substrate is arranged on the electrostatic chuck and in a region surrounded by the focus ring.

In plasma etching, ions are required to be made substantially vertically incident on an edge region as well as on a central region of the substrate. Therefore, as described in Patent Document 1, a plasma processing device configured to apply a negative DC voltage to a focus ring has been developed. Applying the negative DC voltage to the focus ring adjusts the position in the height direction of a boundary between sheath and plasma above the focus ring, and thus can adjust the incident angle of ions with respect to the edge region of the substrate.

PRIOR ART DOCUMENTS

Patent Documents

Patent Document 1: Japanese laid-open publication No. 2007-258417

In the plasma etching, it is required to both make the ions substantially vertically incident on the edge region as well as on the central region of the substrate and suppress the change of the plasma state above the substrate.

SUMMARY

According to one exemplary embodiment of the present disclosure, there is provided a plasma etching method. The plasma etching method includes mounting a substrate on a substrate support of a plasma processing device. The substrate support has a lower electrode and an electrostatic chuck and is installed in a chamber of the plasma processing device. The electrostatic chuck is installed on the lower electrode. The substrate is arranged on the electrostatic chuck and in a region surrounded by a focus ring. The plasma etching method further includes determining a plurality of voltages respectively applied to a plurality of electrodes of the electrostatic chuck. The plurality of electrodes includes a first electrode and a second electrode. The first electrode extends below a central region of the substrate. The second electrode extends below an edge region of the substrate. The plurality of voltages is determined such that ions from plasma are vertically incident on both the central region and the edge region while the substrate is held by the electrostatic chuck. The plasma etching method further includes etching the substrate with the ions from the plasma generated in the chamber while the plurality of voltages is respectively applied to the plurality of electrodes.

According to the present disclosure, in a plasma etching method according to one exemplary embodiment, it is possible to both make ions substantially vertically incident on an edge region as well as on a central region of a substrate in plasma etching and suppress a change of plasma state above the substrate.

DETAILED DESCRIPTION

Figure 1:
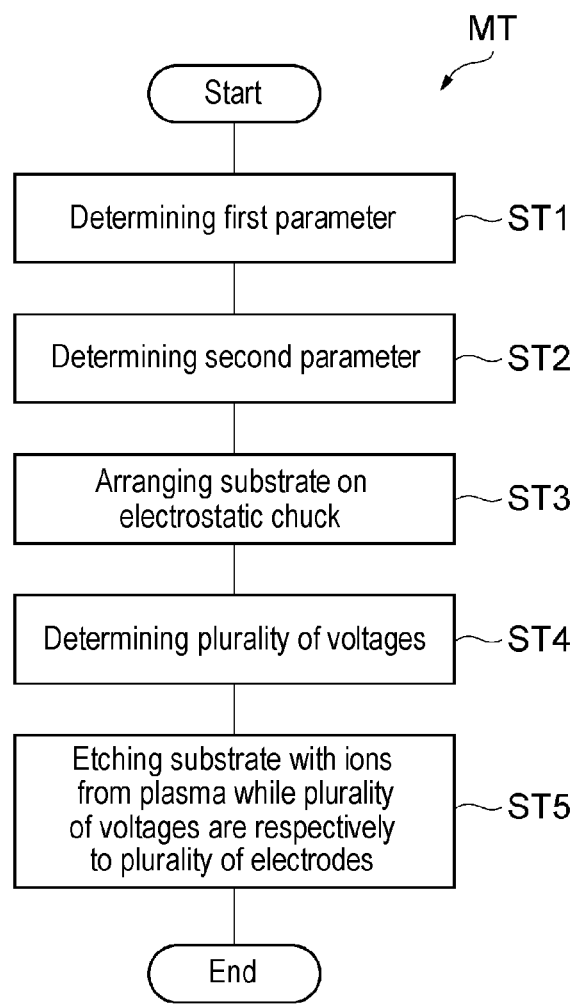
FIG. 1 is a flowchart illustrating a plasma etching method according to an exemplary embodiment of the present disclosure.

Embodiments of the present disclosure will now be described in detail with reference to the accompanying drawings.

In one exemplary embodiment, a plasma etching method is provided. The plasma etching method includes mounting a substrate on a substrate support of a plasma processing device. The substrate support has a lower electrode and an electrostatic chuck and is installed in a chamber of the plasma processing device. The electrostatic chuck is installed on the lower electrode. The substrate is arranged on the electrostatic chuck and in a region surrounded by a focus ring. The plasma etching method further includes determining a plurality of voltages respectively applied to a plurality of electrodes of the electrostatic chuck. The plurality of electrodes includes a first electrode and a second electrode. The first electrode extends below a central region of the substrate. The second electrode extends below an edge region of the substrate. The plurality of voltages is determined such that ions from plasma are vertically incident on both the central region and the edge region while the substrate is held by the electrostatic chuck. The plasma etching method further includes etching the substrate with the ions from the plasma generated in the chamber while the plurality of voltages is respectively applied to the plurality of electrodes.

In the plasma etching method according to one exemplary embodiment, the shape of the substrate is adjusted when the substrate is held by the electrostatic chuck by applying the plurality of determined voltages to the plurality of electrode. The shape of the substrate is adjusted so that an incident angel of the ions with respect to each of the central region and the edge region of the substrate is substantially vertical. The influence of the shape of the substrate held by the electrostatic chuck on the plasma state above the substrate is small Thus, according to this plasma etching method, it is possible to both make the ions substantially vertically incident on the edge region as well as on the central region of the substrate and suppress the change of the plasma state above the substrate.

In one exemplary embodiment, the plurality of voltages may be determined using a predetermined relationship between the plurality of voltages respectively applied to the plurality of electrodes and a set of a first parameter indicating a state of the focus ring and a second parameter indicating a state of warpage of the substrate.

In one exemplary embodiment, the first parameter may be a thickness of the focus ring, a position of an upper surface of the focus ring in a height direction, or an integration time during which the focus ring is exposed to the plasma in the chamber.

In one exemplary embodiment, the second parameter may be acquired by optical or electrical measurement of the substrate before the substrate is held by the electrostatic chuck.

In one exemplary embodiment, the plurality of voltages may be determined to correct an angle of an opening formed in a test substrate by plasma etching of the test substrate in the chamber.

In one exemplary embodiment, the plurality of voltages respectively applied to the plurality of electrodes is determined so that the position of the upper surface of the edge region in the height direction becomes lowered according to an increase of a distance from a central axis when the ions are incident on the edge region along a direction inclined toward the central axis of the substrate. The plurality of voltages is determined so that the upper surface of the edge region becomes horizontal when the ions are incident on the edge region along the vertical direction.

In one exemplary embodiment, the substrate may be deformed by respectively applying the plurality of voltages to the plurality of electrodes.

In one exemplary embodiment, in a region including the second electrode, the upper surface of the electrostatic chuck is formed so that a position of the electrostatic chuck in a height direction is lowered according to an increase of a distance from a center of the electrostatic chuck in a radial direction.

In another exemplary embodiment, a plasma processing device is provided. The plasma processing device includes; a chamber; a substrate support; a radio-frequency power source; one or more DC power sources; and a controller. The substrate support is installed in the chamber. The substrate support has a lower electrode and an electrostatic chuck. The electrostatic chuck is installed on the lower electrode. The electrostatic chuck has a plurality of electrodes. The plurality of electrodes includes a first electrode and a second electrode. The first electrode extends below a central region of the substrate arranged on the electrostatic chuck and in a region surrounded by a focus ring. The second electrode extends below an edge region of the substrate. The radio-frequency power source is coupled to the lower electrode. The one or more DC power sources are configured to apply a plurality of individually adjusted voltages to the plurality of electrodes. The controller is configured to determine the plurality of voltages so that ions from plasma are substantially vertically incident on both the central region and the edge region while the substrate is held by the electrostatic chuck. The controller is configured to control the plurality of DC power sources so as to apply the plurality of determined voltages to the plurality of electrodes.

In one exemplary embodiment, the controller may be configured to determine the plurality of voltages using a predetermined relationship between the plurality of voltages respectively applied to the plurality of electrodes and a set of a first parameter and a second parameter. The first parameter is a parameter indicating a state of the focus ring. The second parameter is a parameter indicating a state of warpage of the substrate.

In one exemplary embodiment, the first parameter may be a thickness of the focus ring, a position of an upper surface of the focus ring in a height direction, or an integration time during which the focus ring is exposed to the plasma in the chamber.

In one exemplary embodiment, the controller may be configured to use the second parameter achieved by optical or electrical measurement of the substrate before the substrate is held by the electrostatic chuck, in order to determine the plurality of voltages.

In one exemplary embodiment, the plurality of voltages may be determined in advance so as to correct an angle of an opening formed in a test substrate by plasma etching on the test substrate in the chamber.

In one exemplary embodiment, the controller is configured to determine the plurality of voltages respectively applied to the plurality of electrodes so that the position of the upper surface of the edge region in the height direction becomes lowered according to an increase of a distance from a central axis when the ions are incident on the edge region along a direction inclined toward the central axis of the substrate. The controller is configured to determine the plurality of voltages so that the upper surface of the edge region becomes horizontal when the ions are incident on the edge region along the vertical direction.

In one exemplary embodiment, the controller may be configured to determine the plurality of voltages so as to deform the substrate.

In one exemplary embodiment, in a region including the second electrode, the upper surface of the electrostatic chuck may be formed so that a position of the electrostatic chuck in a height direction is lowered according to an increase of a distance from a center of the electrostatic chuck in a radial direction.

Various exemplary embodiments will now be described in detail with reference to the drawings. Further, like or corresponding parts in each drawing are denoted by like reference numerals.

Figure 2:
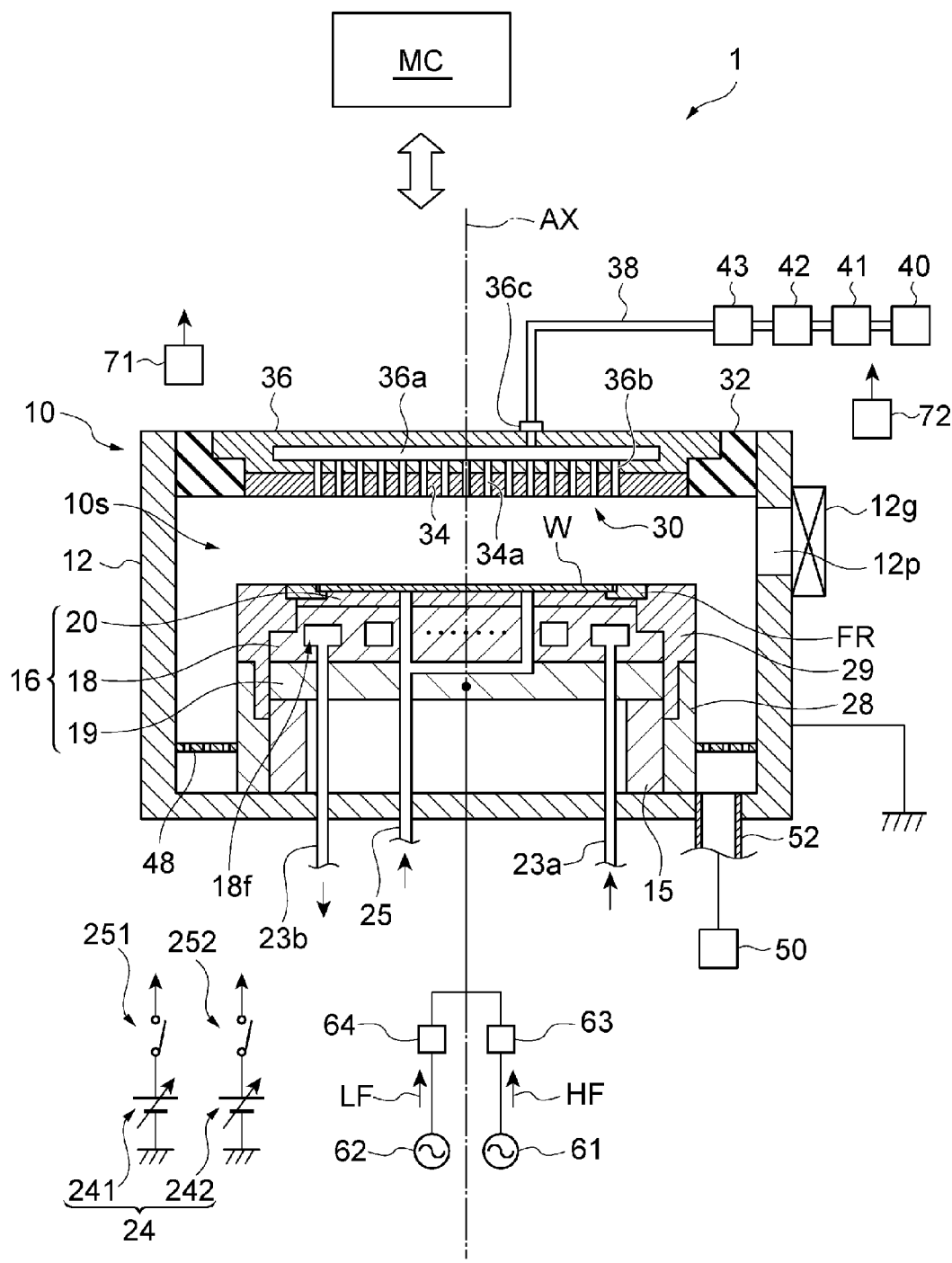
FIG. 2 is a diagram schematically illustrating a plasma processing device according to an exemplary embodiment of the present disclosure.

FIG. 1 is a flowchart illustrating a plasma etching method according to an exemplary embodiment of the present disclosure. A plasma processing device is used to perform the plasma etching method (hereinafter, referred to as "method MT") illustrated in FIG. 1. FIG. 2 is a diagram schematically illustrating a plasma processing device according to an exemplary embodiment of the present disclosure. A plasma processing device 1 illustrated in FIG. 2 can be used in performing the method MT.

The plasma processing device 1 is a capacitively coupled plasma processing device. The plasma processing device 1 includes a chamber 10. The chamber 10 provides an internal space 10s therein. In one embodiment, the chamber 10 includes a chamber body 12. The chamber body 12 has a substantially cylindrical shape. The internal space 10s is provided in the chamber body 12. The chamber body 12 is made of, for example, aluminum. The chamber body 12 is electrically grounded. A film having plasma resistance is formed on an inner wall surface of the chamber body 12, i.e., a wall surface defining the internal space 10s. This film may be a ceramic film such as a film formed by anodizing or a film formed from yttrium oxide.

A passage 12p is formed on a sidewall of the chamber body 12. A substrate W passes through the passage 12p when it is transferred between the internal space 10s and the outside of the chamber 10. A gate valve 12g is installed along the sidewall of the chamber body 12 for opening and closing the passage 12p.

A substrate support, i.e., a support table 16, is installed in the chamber 10. The support table 16 is configured to support the substrate W mounted thereon. The substrate W has a substantially disc shape. The support base 16 is supported by a support part 15. The support part 15 extends upward from the bottom of the chamber body 12. The support part 15 has a substantially cylindrical shape. The support part 15 is made of an insulating material such as quartz.

The support table 16 may have a lower electrode 18 and an electrostatic chuck 20. The support table 16 may further have an electrode plate 19. The electrode plate 19 is made of a conductive material such as aluminum and has a substantially disc shape. The lower electrode 18 is installed on the electrode plate 19. The lower electrode 18 is made of a conductive material such as aluminum and has a substantially disc shape. The lower electrode 18 is electrically coupled to the electrode plate 19.

A flow passage 18f is formed in the lower electrode 18. The flow passage 18f is a flow passage for a heat exchange medium. As the heat exchange medium, a liquid coolant or a coolant (for example, freon) for cooling the lower electrode 18 by its vaporization may be used. A circulation device (for example, a chiller unit) for the heat exchange medium is connected to the flow passage 18f. This circulation device is installed outside the chamber 10. The heat exchange medium is supplied from the circulation device to the flow passage 18f via a pipe 23a. The heat exchange medium supplied to the flow passage 18f is returned to the circulation device via a pipe 23b.

Figure 3:
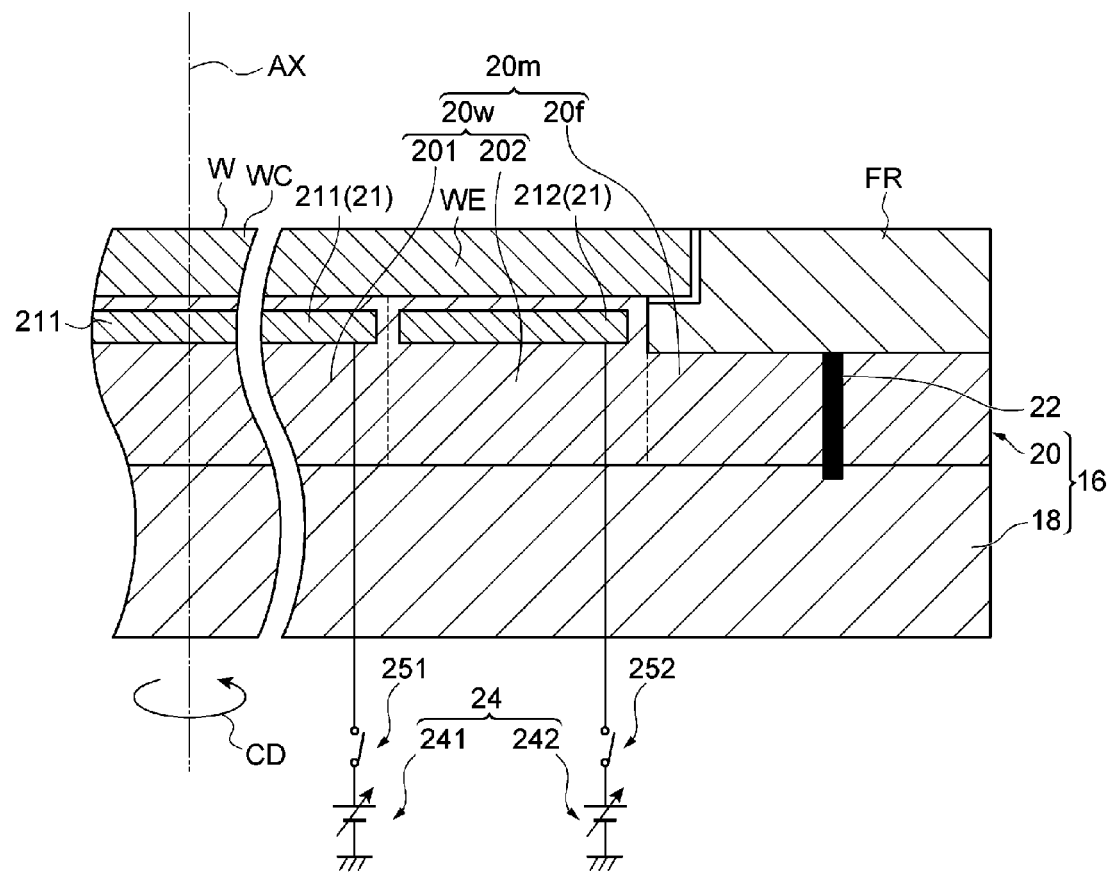
FIG. 3 is a vertical cross-sectional view illustrating a part of a substrate support of the plasma processing device according to an exemplary embodiment of the present disclosure.
Figure 4:
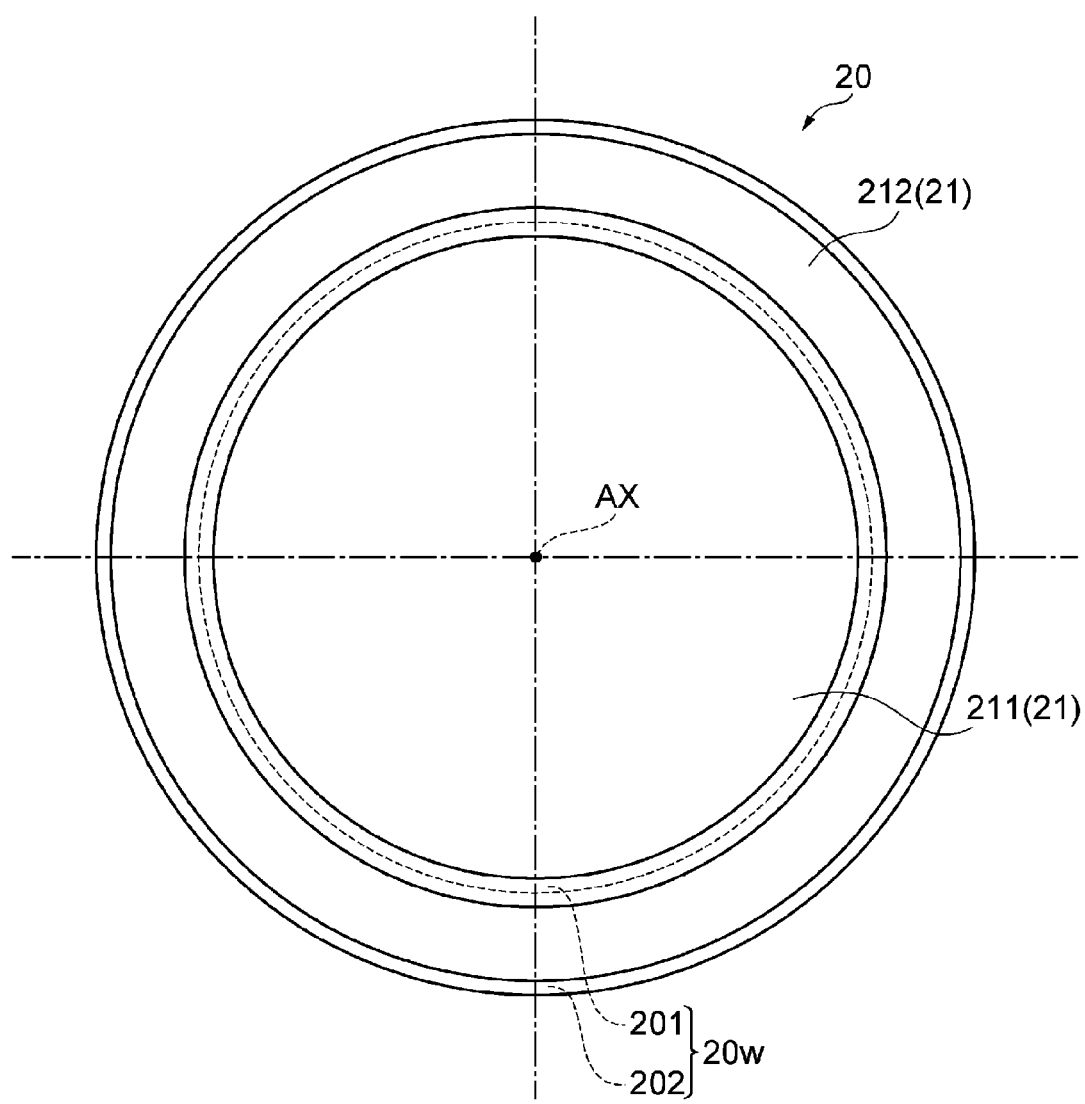
FIG. 4 is a diagram schematically illustrating a configuration of a part of an electrostatic chuck of the plasma processing device according to an exemplary embodiment of the present disclosure in a cross section.

Reference will now be made to FIG. 3 and FIG. 4 together with FIG. 2. FIG. 3 is a vertical cross-sectional view illustrating a part of the substrate support of the plasma processing device according to an exemplary embodiment of the present disclosure. FIG. 4 is a diagram schematically illustrating a configuration of a part of the electrostatic chuck of the plasma processing device according to an exemplary embodiment of the present disclosure in a cross section. The electrostatic chuck 20 is installed on the lower electrode 18. The substrate W is mounted on the electrostatic chuck 20 and held by the electrostatic chuck 20 when it is processed in the internal space 10s.

The electrostatic chuck 20 has a main body 20m and a plurality of electrodes 21. The main body 20m is formed of a dielectric material such as aluminum oxide or aluminum nitride. The main body 20m has a substantially disc shape. The main body 20m includes a substrate mounting region 20w and a focus ring mounting region 20f. The substrate mounting region 20w is a region having a substantially disc shape. In one embodiment, the upper surface of the substrate mounting region 20w extends along a horizontal plane. The substrate mounting region 20w shares a central axis (axis AX in the drawing) with the electrostatic chuck 20 and the main body 20m. The substrate W is mounted on the upper surface of the substrate mounting region 20w when it is processed in the chamber 10.

The focus ring mounting region 20f extends in the circumferential direction (direction CD in the drawing) so as to surround the substrate mounting region 20w around the central axis of the electrostatic chuck 20. A focus ring FR is mounted on an upper surface of the focus ring mounting region 20f. The focus ring FR has an annular shape and extends in the circumferential direction around the central axis (axis AX in the drawing) of the ring. The substrate W is arranged in a region surrounded by the focus ring FR. That is, the focus ring FR surrounds the edge of the substrate W mounted on the substrate mounting region 20w of the electrostatic chuck 20. The focus ring FR may have conductivity. The focus ring FR is made of, for example, silicon or silicon carbide. The focus ring FR may be connected to the lower electrode 18 via a conductor 22.

The plurality of electrodes 21 of the electrostatic chuck 20 is film-like electrodes. The plurality of electrodes 21 is installed in the main body 20m. The substrate mounting region 20w includes a first region 201 and a second region 202. The first region 201 is a region extending below a central region WC of the substrate W. The first region 201 is a region having a substantially disc shape, and shares the central axis line (axis AX in the drawing) with the substrate mounting region 20w. The second region 202 is a region extending below an edge region WE of the substrate W. The second region 202 extends in the circumferential direction (direction CD in the drawing) so as to surround the first region 201 around the central axis of the substrate mounting region 20w.

The plurality of electrodes 21 includes a first electrode 211 and a second electrode 212. The first electrode 211 extends below the central region WC of the substrate W. The first electrode 211 is installed in the first region 201. The first electrode 211 may have a substantially circular planar shape. The first electrode 211 may share the central axis (axis AX in the drawing) with the first region 201. The diameter of the first electrode 211 is smaller than the diameter of the first region 201. The second electrode 212 extends below the edge region WE of the substrate W. The second electrode 212 is installed in the second region 202. The planar shape of the second electrode 212 may be annular and band-shaped. The second electrode 212 extends in the circumferential direction around the central axis of the first region 201. The inner diameter of the second electrode 212 is larger than the inner diameter of the second region 202, and the outer diameter of the second electrode 212 is smaller than the outer diameter of the second region 202.

One or more DC power sources 24 are electrically coupled to the plurality of electrodes 21. The one or more DC power sources 24 are configured to apply individually adjusted DC voltages to the plurality of electrodes 21. In one embodiment, the plasma processing device 1 includes a DC power source 241 and a DC power source 242 as the one or more DC power sources 24. Each of the DC power source 241 and the DC power source 242 is a variable DC power source. The DC power source 241 is electrically coupled to the first electrode 211 via a switch 251. The DC power source 242 is electrically coupled to the second electrode 212 via a switch 252. When the DC voltages are applied to the plurality of electrodes 21 of the electrostatic chuck 20 from the one or more DC power sources 24, an electrostatic attractive force is generated between the electrostatic chuck 20 and the substrate W. The substrate W is attracted to and held by the electrostatic chuck 20 by the generated electrostatic attractive force.

The plasma processing device 1 may further include a gas supply line 25. The gas supply line 25 supplies a heat transfer gas from a gas supply mechanism, for example, an He gas, between the upper surface of the electrostatic chuck 20 and a rear surface (lower surface) of the substrate W.

The plasma processing device 1 may further include a tubular part 28 and an insulating part 29. The tubular part 28 extends upward from the bottom of the chamber body 12. The tubular part 28 extends along the outer periphery of the support part 15. The tubular part 28 is made of a conductive material and has a substantially cylindrical shape. The tubular part 28 is electrically grounded. The insulating part 29 is installed on the tubular part 28. The insulating part 29 is made of an insulating material. The insulating part 29 is made of, for example, a ceramic such as quartz. The insulating part 29 has a substantially cylindrical shape. The insulating part 29 extends along the outer periphery of the electrode plate 19, the outer periphery of the lower electrode 18, and the outer periphery of the electrostatic chuck 20.

The plasma processing device 1 further includes an upper electrode 30. The upper electrode 30 is installed above the support table 16. The upper electrode 30 closes an upper opening of the chamber body 12 together with a member 32. The member 32 has an insulating property. The upper electrode 30 is supported on the upper portion of the chamber body 12 via the member 32.

The upper electrode 30 includes a ceiling plate 34 and a support 36. The lower surface of the ceiling plate 34 defines the internal space 10s. A plurality of gas discharge holes 34a is formed in the ceiling plate 34. Each of the plurality of gas discharge holes 34a penetrates the ceiling plate 34 in a plate thickness direction (vertical direction). The ceiling plate 34 is made of, for example, but not limited to, silicon. Alternatively, the ceiling plate 34 may have a structure in which a plasma resistant film is formed on a surface of an aluminum member. This film may be a ceramic film such as a film formed by anodizing or a film formed from yttrium oxide.

The support 36 detachably supports the ceiling plate 34. The support 36 is made of, for example, a conductive material such as aluminum. A gas diffusion chamber 36a is formed inside the support 36. A plurality of gas holes 36b extends downward from the gas diffusion chamber 36a. The plurality of gas holes 36b communicates with the plurality of gas discharge holes 34a, respectively. A gas introduction port 36c is formed in the support 36. The gas introduction port 36c is connected to the gas diffusion chamber 36a. A gas supply pipe 38 is connected to the gas introduction port 36c.

A gas source group 40 is connected to the gas supply pipe 38 via a valve group 41, a flow rate controller group 42, and a valve group 43. The gas source group 40, the valve group 41, the flow rate controller group 42, and the valve group 43 constitute a gas supply part. The gas source group 40 includes a plurality of gas sources. Each of the valve group 41 and the valve group 43 includes a plurality of valves (for example, opening/closing valves). The flow rate controller group 42 includes a plurality of flow rate controllers. Each of the plurality of flow rate controllers in the flow rate controller group 42 is a mass flow controller or a pressure control type flow rate controller. Each of the plurality of gas sources in the gas source group 40 is connected to the gas supply pipe 38 via the corresponding valve of the valve group 41, the corresponding flow rate controller of the flow rate controller group 42, and the corresponding valve of the valve group 43. The plasma processing device 1 may supply gases from one or more gas sources selected from the plurality of gas sources of the gas source group 40 to the internal space 10s at individually adjusted flow rates.

A baffle plate 48 is installed between the tubular part 28 and the sidewall of the chamber body 12. The baffle plate 48 may be formed by, for example, coating an aluminum member with a ceramic such as yttrium oxide. A plurality of through holes is formed in the baffle plate 48. An exhaust pipe 52 is connected to the bottom of the chamber body 12 below the baffle plate 48. An exhaust device 50 is connected to the exhaust pipe 52. The exhaust device 50 has a pressure controller such as an automatic pressure control valve and a vacuum pump such as a turbo molecular pump or the like, and can reduce a pressure in the internal space 10s.

In one embodiment, the plasma processing device 1 may further include a radio-frequency power source 61. The radio-frequency power source 61 is a power source that generates radio-frequency power HF for plasma generation. The radio-frequency power HF has a frequency within the range of 27 to 100 MHz, for example, a frequency of 40 MHz or 60 MHz. The radio-frequency power source 61 is coupled to the lower electrode 18 via a matching device 63 and the electrode plate 19 in order to supply the radio-frequency power HF to the lower electrode 18. The matching device 63 has a matching circuit for matching the output impedance of the radio-frequency power source 61 with the impedance on a load side (lower electrode 18 side). Also, the radio-frequency power source 61 may not be electrically coupled to the lower electrode 18 and may be coupled to the upper electrode 30 via the matching device 63.

The plasma processing device 1 further includes a radio-frequency power source 62. The radio-frequency power source 62 is a power source that generates a bias radio-frequency power for drawing ions into the substrate W, i.e., radio-frequency power LF. The frequency of the radio-frequency power LF is lower than the frequency of the radio-frequency power HF. The frequency of the radio-frequency power LF is a frequency within the range of 400 kHz to 13.56 MHz, for example, 400 kHz. The radio-frequency power source 62 is coupled to the lower electrode 18 via the matching device 64 and the electrode plate 19 in order to supply the radio-frequency power LF to the lower electrode 18. The matching device 64 has a matching circuit for matching the output impedance of the radio-frequency power source 62 with the impedance on the load side (lower electrode 18 side).

In this plasma processing device 1, a gas is supplied to the internal space 10s. Then, the gas is excited in the internal space 10s by supplying the radio-frequency power HF, supplying the radio-frequency power LF, or supplying the radio-frequency power HF and the radio-frequency power LF. As a result, plasma is generated in the internal space 10s. The substrate W is processed by chemical species such as ions and/or radicals from the generated plasma.

In one embodiment, the plasma processing device 1 may further include a first measuring device 71 and a second measuring device 72. The first measuring device 71 is configured to acquire a first parameter. The first parameter represents the state of the focus ring. The first parameter is, for example, a thickness of the focus ring FR or a position of the upper surface of the focus ring FR in the height direction on the focus ring mounting region 20f. The first measuring device 71 may optically or electrically measure the first parameter. The first measuring device 71 may be, for example, a device that uses light to measure the thickness of the focus ring FR or the position of the upper surface of the focus ring FR in the height direction on the focus ring mounting region 20f. Alternatively, the first measuring device 71 may be a device that electrically measures an electrical parameter (for example, capacitance) of the focus ring FR to achieve the thickness of the focus ring FR. The first parameter may also be an integration time during which the focus ring FR is exposed to plasma in the chamber 10. In this case, the first parameter is acquired by a controller MC as described hereinbelow.

The second measuring device 72 is configured to acquire a second parameter. The second parameter represents the state of warpage of the substrate W. The second measuring device 72 may achieve the second parameter by optical or electrical measurement of the substrate W before the substrate W is held by the electrostatic chuck 20. For example, the second measuring device 72 measures, as the second parameter, a three-dimensional shape of the upper surface of the substrate W by optical or electrical measurement of the substrate W before the substrate W is held by the electrostatic chuck 20.

The plasma processing device 1 further includes the controller MC. The controller MC is a computer including a processor, a storage device, an input device, a display device and the like, and controls each part of the plasma processing device 1. Specifically, the controller MC executes a control program stored in the storage device so as to control each part of the plasma processing device 1 based on recipe data stored in the storage device. Under the control of the controller MC, a process specified by the recipe data is executed in the plasma processing device 1. Plasma etching methods according to various embodiments may be executed in the plasma processing device 1 by the controller MC controlling of each part of the plasma processing device 1.

Figure 5A:
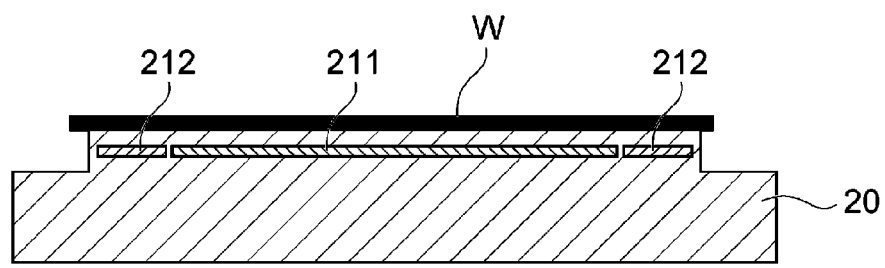
FIG. 5A is a cross-sectional view illustrating an example of a state where a substrate with no warpage is mounted on the electrostatic chuck.
Figure 5B:
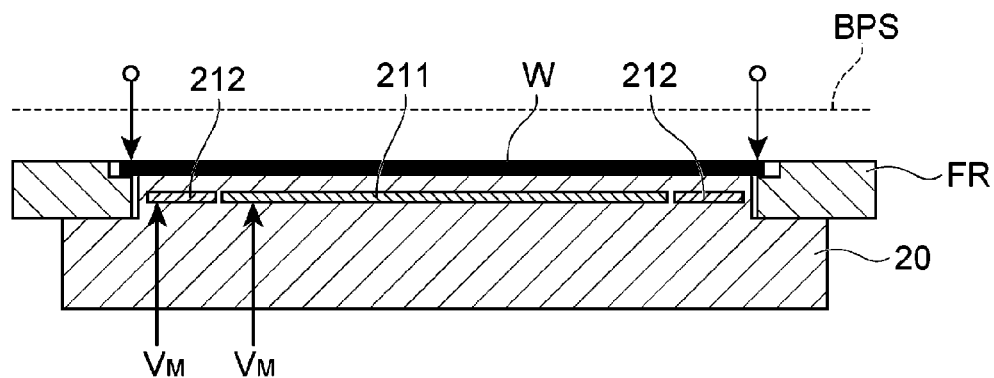
FIGS. 5B and 5C are cross-sectional views illustrating an example of a state where the substrate illustrated in FIG. 5A is held by the electrostatic chuck.
Figure 5C:
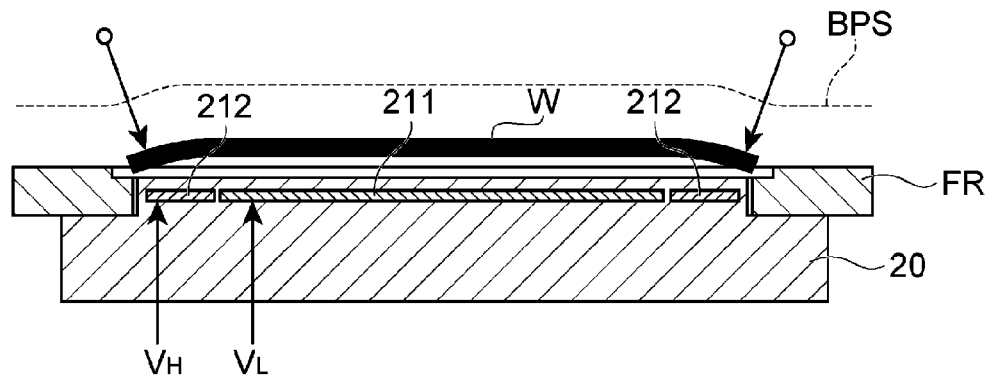
Figure 6A:
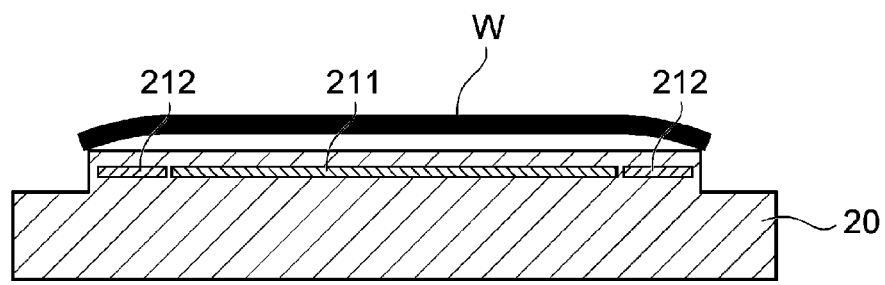
FIG. 6A is a cross-sectional view illustrating an example of a state where a substrate with a convex warpage is mounted on the electrostatic chuck.
Figure 6B:
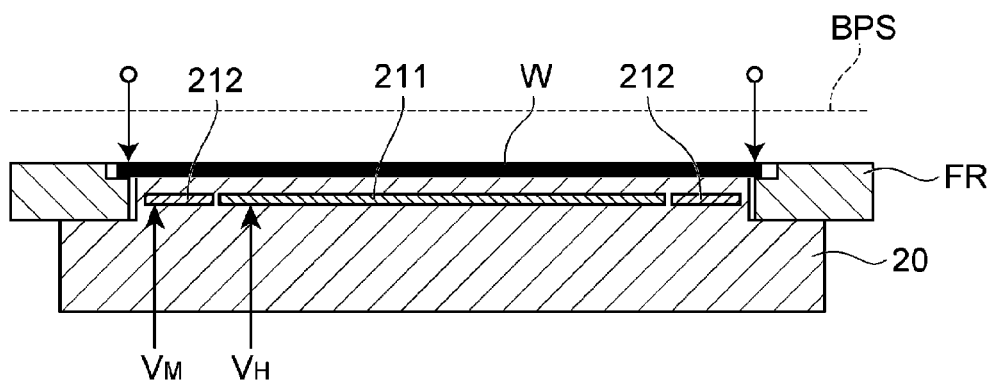
FIGS. 6B and 6C are cross-sectional views illustrating an example of a state where the substrate illustrated in FIG. 6A is held by the electrostatic chuck.
Figure 6C:
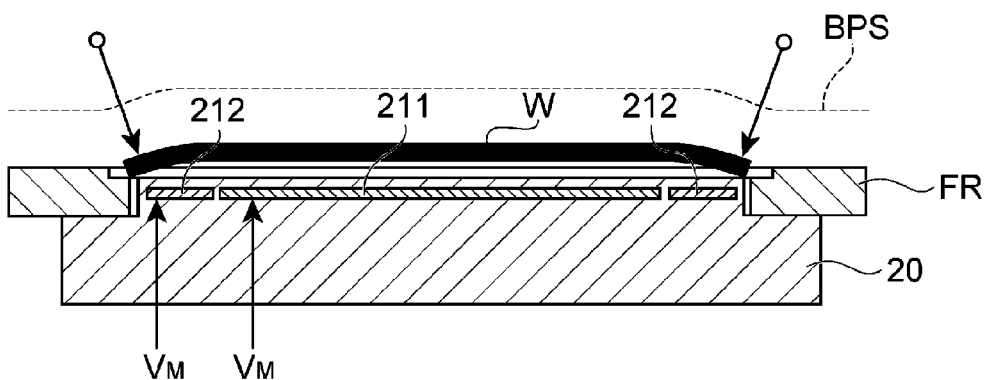
Figure 7A:
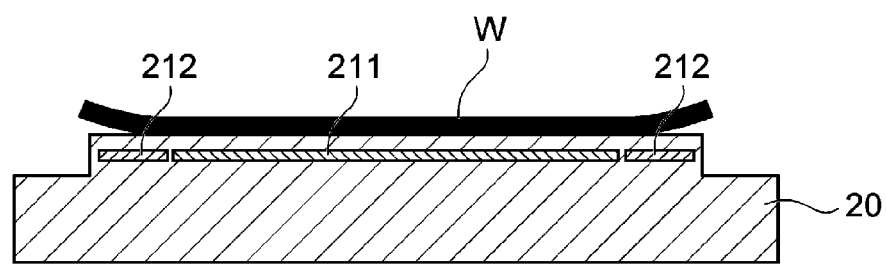
FIG. 7A is a cross-sectional view illustrating an example of a state where a substrate with a recessed warpage is mounted on the electrostatic chuck.
Figure 7B:
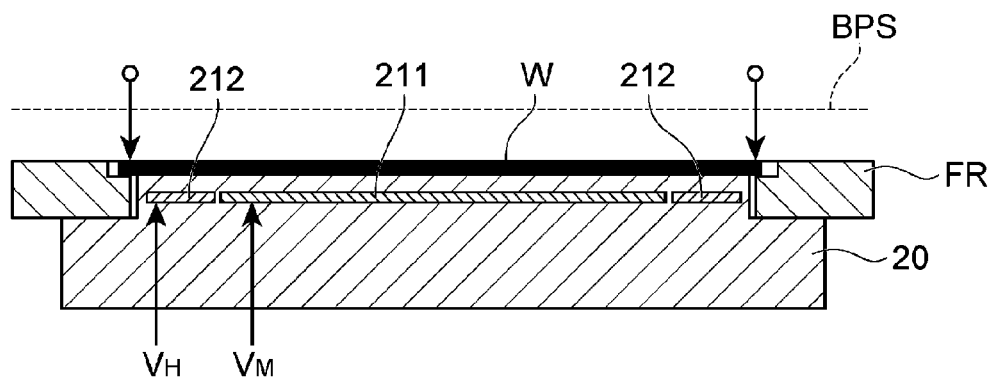
FIGS. 7B and 7C are cross-sectional views illustrating an example of a state where the substrate illustrated in FIG. 7A is held by the electrostatic chuck.
Figure 7C:
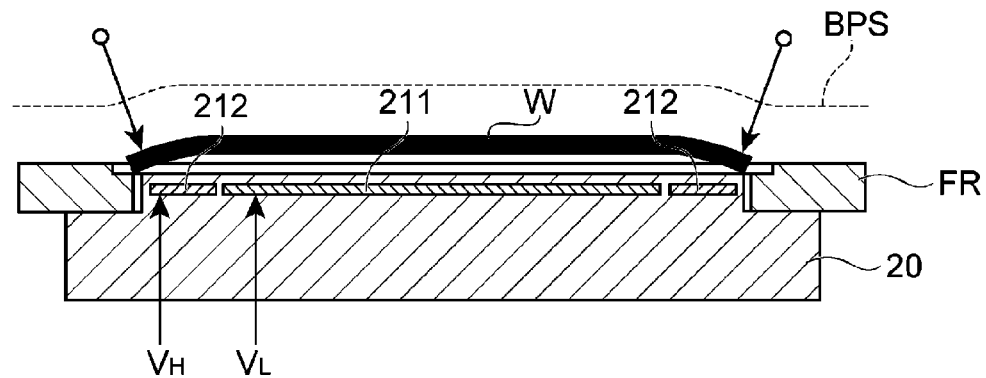

Returning to FIG. 1, the method MT will now be described. In the following description, the control of each part of the plasma processing device 1 by the controller MC will also be described. In the following description, reference will be made to FIG. 5A, FIG. 5B, FIG. 5C, FIG. 6A, FIG. 6B, FIG. 6C, FIG. 7A, FIG. 7B, and FIG. 7C, in addition to FIG. 1. FIG. 5A is a cross-sectional view illustrating an example of a state where a substrate with no warpage is mounted on the electrostatic chuck. FIGS. 5B and 5C are cross-sectional views illustrating an example of a state where the substrate illustrated in FIG. 5A is held by the electrostatic chuck. FIG. 6A is a sectional view illustrating an example of a state where a substrate with a convex warpage is mounted on the electrostatic chuck. FIGS. 6B and 6C are cross-sectional views illustrating an example of a state where the substrate illustrated in FIG. 6A is held by the electrostatic chuck. FIG. 7A is a cross-sectional view illustrating an example of a state where a substrate with a recessed warpage is mounted on the electrostatic chuck. FIGS. 7B and 7C are cross-sectional views illustrating an example of a state where the substrate illustrated in FIG. 7A is held by the electrostatic chuck.

FIGS. 5B, 6B, and 7B illustrate a case where the focus ring FR is in an initial state or a case where the focus ring FR is exposed to plasma for a short integration time. When the focus ring FR is in an initial state or when the focus ring FR is exposed to plasma for a short integration time, the focus ring FR is not substantially consumed (worn), and thus has a relatively large thickness. FIGS. 5C, 6C, and 7C illustrate a case where the focus ring FR is consumed. When the focus ring FR is consumed, the thickness of the focus ring FR is small.

As illustrated in FIG. 1, at step ST1 of the method MT, the first parameter is determined. As described above, the first parameter represents the state of the focus ring. The first parameter is, for example, the thickness of the focus ring FR or the position of the upper surface of the focus ring FR in the height direction on the focus ring mounting region 20*f*. The first parameter may be measured by the first measuring device 71. Alternatively, the first parameter may be an integration time during which the focus ring FR is exposed to plasma in the chamber 10. In this case, the first parameter is acquired by the controller MC.

At step ST2, the second parameter is determined. As described above, the second parameter represents the state of warpage of the substrate W before it is held by the electrostatic chuck 20. The second parameter may be achieved by the second measuring device 72. Step ST2 may be executed before step ST1.

At step ST3, the substrate W is mounted on the support table 16. The substrate W is arranged on the upper surface of the substrate mounting region 20*w* of the electrostatic chuck 20 and in the region surrounded by the focus ring FR. Step ST3 may be performed before step ST1 or before step ST2, or may be performed after step ST4 as described hereinbelow.

At step ST4, a plurality of voltages $V_{ESC}$ applied to the plurality of electrodes 21 of the electrostatic chuck 20 in order to hold the substrate W by the electrostatic chuck 20 is determined. The plurality of voltages $V_{ESC}$ may be determined by the controller MC. The plurality of voltages $V_{ESC}$ is determined so that ions from plasma generated at step ST5 while the substrate W is held by the electrostatic chuck 20 are substantially vertically incident on both the central region WC and the edge region WE of the substrate W. Substantially vertically may mean that the incident angle of ions is 90°±0.15°.

In one embodiment, the plurality of voltages $V_{ESC}$ is determined using a predetermined relationship between a set of first and second parameters and the plurality of voltages. This relationship is stored in the storage device of the controller MC as a function or a table. The controller MC specifies a plurality of voltages corresponding to the first parameter and the second parameter respectively determined at step ST1 and step ST2 by using the function or table, and determines the plurality of specified voltages as the plurality of voltages $V_{ESC}$.

In another embodiment, plasma etching is performed on a test substrate in the chamber 10 prior to performing step ST4. Then, an angle of an opening formed in the test substrate by this plasma etching may be obtained. Subsequently, the plurality of voltages $V_{ESC}$ is determined to correct the obtained angle of the opening to become vertical. In the present embodiment, steps ST1 and ST2 will be omitted from the method MT.

At subsequent step ST5, plasma etching of the substrate W is performed. At step ST5, plasma is formed from the gas in the chamber 10 while the plurality of voltages $V_{ESC}$ is applied to the plurality of electrodes 21. At step ST5, the substrate W is etched by irradiating the substrate W with ions from the generated plasma. At step ST5, the gas supply part is controlled by the controller MC so as to supply a gas into the chamber 10 at a designated flow rate. At step ST5, the exhaust device 50 is controlled by the controller MC so that the internal pressure of the chamber 10 is set at a designated pressure. At step ST5, the radio-frequency power source 61 and/or the radio-frequency power source 62 are controlled by the controller MC so as to supply the radio-frequency power HF and/or the radio-frequency power LF. At step ST5, the one or more DC power sources 24 are controlled by the controller MC so as to respectively (independently) apply the plurality of determined voltages $V_{ESC}$ to the plurality of electrodes 21.

As illustrated in FIGS. 5B, 6B, and 7B, when the focus ring FR is not substantially consumed, at step ST4, the plurality of voltages $V_{ESC}$ is determined so that the upper surface of the substrate W held by the electrostatic chuck 20 is substantially flat. That is, when the focus ring FR is not substantially consumed, the plurality of voltages $V_{ESC}$ is determined so that the upper surface of the central region WC and the upper surface of the edge region WE of the substrate W held by the electrostatic chuck 20 are substantially horizontal. As a result, the position of the upper surface of the substrate W in the height direction and the position of the upper surface of the focus ring FR in the height direction become substantially equal. When the position of the upper surface of the substrate W in the height direction and the position of the upper surface of the focus ring FR in the height direction are substantially equal, the position of a boundary BPS between plasma and sheath on the focus ring FR in the height direction becomes substantially equal to the position of the boundary BPS above the substrate W in the height direction. Therefore, as illustrated in FIGS. 5B, 6B, and 7B, at step ST5, the ions from the plasma are incident on both the central region WC and the edge region WE of the substrate W along the vertical direction. Thus, the ions are vertically incident on both the central region WC and the edge region WE. In addition, in FIGS. 5B, 6B, and 7B, the ions are drawn in a circular figure.

For example, when the substrate W with no warpage is arranged in the region surrounded by the focus ring FR which is not substantially consumed, the voltages respectively applied to the first electrode 211 and the second electrode 212 are the same $V_M$, as illustrated in FIG. 5B. When the substrate W with a convex warpage is arranged in the region surrounded by the focus ring FR which is not substantially consumed, the voltages respectively applied to the first electrode 211 and the second electrode 212 are $V_H$ and $V_M$, as illustrated in FIG. 6B. As a result, the substrate W is held by the electrostatic chuck 20 while it is deformed from the shape illustrated in FIG. 6A to the shape illustrated in FIG. 6B. When the substrate W with a recessed warpage is arranged in the region surrounded by the focus ring FR which is not substantially consumed, the voltages respectively applied to the first electrode 211 and the second electrode 212 are $V_M$ and $V_H$, as illustrated in FIG. 7B. As a result, the substrate W is held by the electrostatic chuck 20 while it is deformed from the shape illustrated in FIG. 7A to the shape illustrated in FIG. 7B. Furthermore, $V_H$ and $V_M$ have a relationship of $V_H > V_M$.

As illustrated in FIGS. 5C, 6C, and 7C, when the focus ring FR is consumed, the position of the boundary BPS between the plasma and the sheath on the focus ring FR in the height direction is lower than the position of the boundary BPS above the substrate W in the height direction. Therefore, at step ST5, the ions from the plasma are incident on the central region WC of the substrate W along a substantially vertical direction, and are incident on the edge region WE of the substrate W along a direction inclined toward the central axis of the substrate W. At step ST4, as illustrated in FIGS. 5C, 6C, and 7C, when the focus ring FR is consumed, the plurality of voltages $V_{ESC}$ is determined so that the position of the upper surface of the edge region WE in the height direction is lowered according to an increase of a distance from the central axis of the substrate W. That is, when the focus ring FR is consumed, the plurality of voltages $V_{ESC}$ is determined so that the upper surface of the substrate W held by the electrostatic chuck 20 has a convex shape. As a result, at step ST5, the ions are vertically incident on both the central region WC and the edge region WE. Also, in FIGS. 5C, 6C, and 7C, the ions are drawn in a circular figure.

For example, when the substrate W with no warpage is arranged in the region surrounded by the focus ring FR which is consumed, the voltages respectively applied to the first electrode 211 and the second electrodes 212 are $V_L$ and $V_H$, as illustrated in FIG. 5C. As a result, the substrate W is held by the electrostatic chuck 20 while it is deformed from the shape illustrated in FIG. 5A to the shape illustrated in FIG. 5C. When the substrate W with a convex warpage is arranged in the region surrounded by the focus ring FR which is consumed, the voltages respectively applied to the first electrode 211 and the second electrode 212 are the same $V_M$, as illustrated in FIG. 6C. When the substrate W with a recessed warpage is arranged in the region surrounded by the focus ring FR which is consumed, the voltages respectively applied to the first electrode 211 and the second electrode 212 are $V_L$ and $V_H$, as illustrated in FIG. 7C. As a result, the substrate W is held by the electrostatic chuck 20 while it is deformed from the shape illustrated in FIG. 7A to the shape illustrated in FIG. 7C. Furthermore, $V_H$, $V_M$, and $V_L$ have a relationship of $V_H > V_M > V_L$.

In the method MT and the plasma processing device 1 described above, the plurality of voltages $V_{ESC}$ determined at step ST4 is applied to the plurality of electrodes 21 such that the substrate W is held by the electrostatic chuck 20. As a result, the shape of the substrate W is adjusted. The shape of the substrate W is adjusted so that the incident angles of the ions with respect to the central region WC and the edge region WE of the substrate W are substantially vertical. The influence of the shape of the substrate held by the electrostatic chuck 20 on the plasma state above the substrate W is small. Thus, it is possible to both make the ions substantially vertically incident on the edge region WE as well as on the central region WC of the substrate W and suppress the change of the plasma state above the substrate W.

Another electrostatic chuck that can be adopted in the plasma processing device 1 will be described hereinbelow. In another embodiment, the electrostatic chuck of the plasma processing device 1 has one or more electrodes, in addition to the first electrode 211 and the second electrode 212. The one or more electrodes extend in the circumferential direction between the first electrode 211 and the second electrode 212. In the present embodiment, the substrate mounting region 20w has one or more regions, in addition to the first region 201 and the second region 202. The one or more regions extend in the circumferential direction between the first region 201 and the second region 202. The one or more electrodes are installed in the one or more regions, respectively. The individually adjusted DC voltages are applied to the plurality of electrodes of the electrostatic chuck including the first electrode 211, the second electrode 212, and the one or more electrodes from the one or more DC power sources 24.

Figure 8:
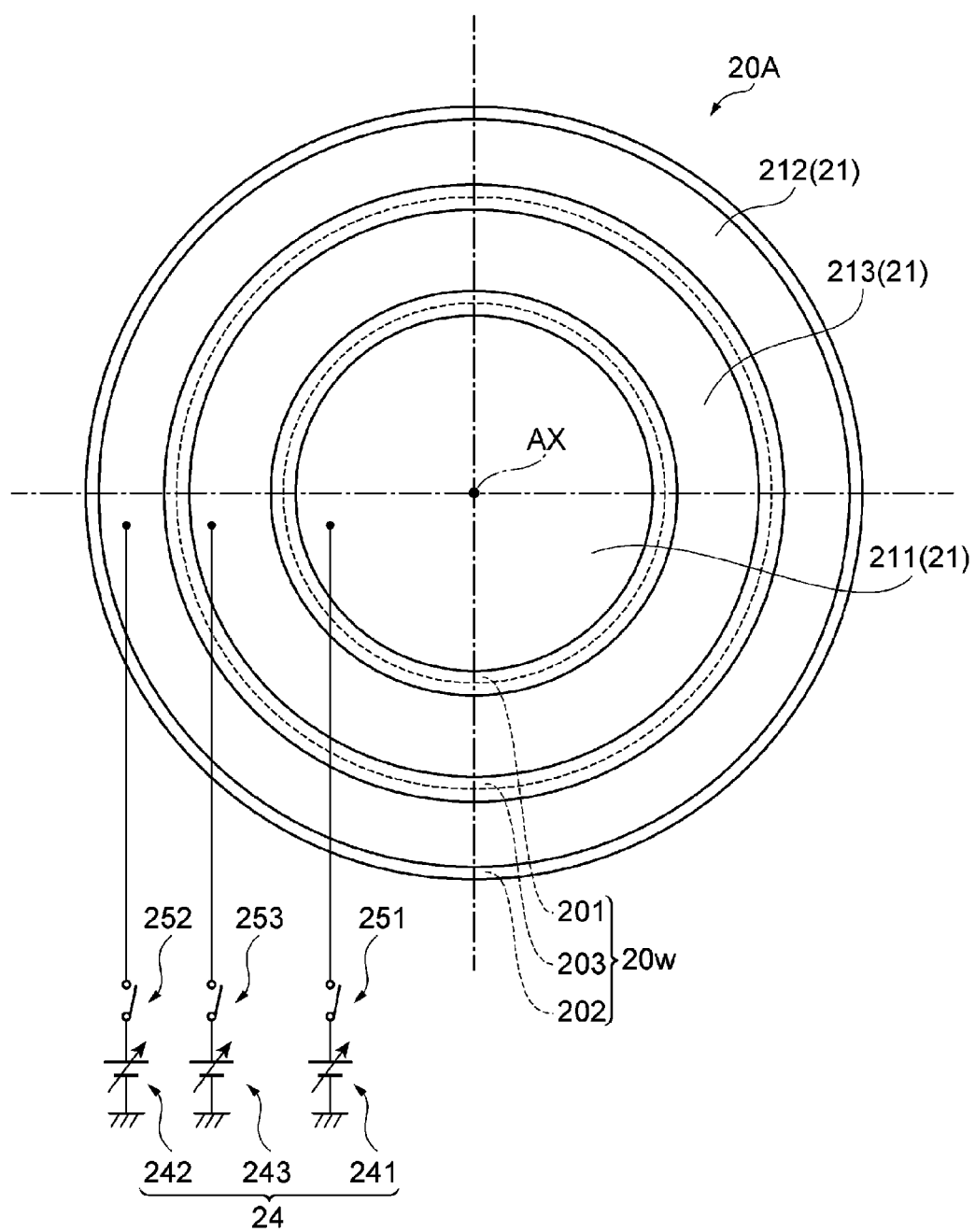
FIG. 8 is a diagram schematically illustrating a configuration of a part of an electrostatic chuck of a plasma processing device according to another exemplary embodiment of the present disclosure in a cross section.

FIG. 8 is a diagram schematically illustrating a configuration of a part of an electrostatic chuck of a plasma processing device according to another exemplary embodiment of the present disclosure in a cross section. Instead of the electrostatic chuck 20, an electrostatic chuck 20A illustrated in FIG. 8 may be adopted as the electrostatic chuck of the plasma processing device 1. The plurality of electrodes 21 of the electrostatic chuck 20A includes a third electrode 213, in addition to the first electrode 211 and the second electrode 212. The third electrode 213 has an annular and band-shaped planar shape. The third electrode 213 extends in the circumferential direction between the first electrode 211 and the second electrode 212. The substrate mounting region 20w has a third region 203, in addition to the first region 201 and the second region 202. The third region 203 extends in the circumferential direction between the first region 201 and the second region 202. The third electrode 213 is installed in the third region 203.

The individually adjusted DC voltages are applied to the plurality of electrodes 21 of the electrostatic chuck 20A including the first electrode 211, the second electrode 212, and the third electrode 213 from the one or more DC power sources 24. The one or more DC power sources 24 may include a DC power source 243, in addition to the DC power source 241 and the DC power source 242. The DC power source 243 is electrically coupled to the third electrode 213 via a switch 253.

Figure 9A:
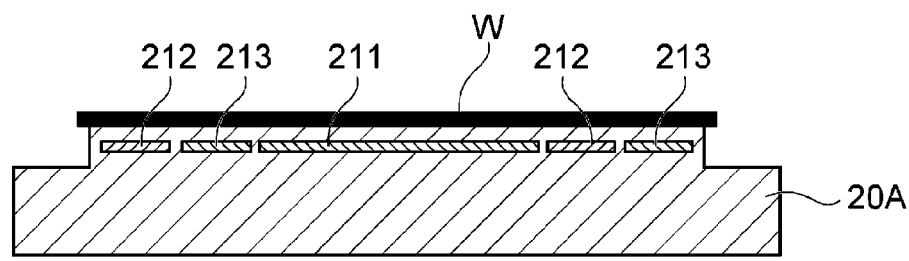
FIG. 9A is a cross-sectional view illustrating an example of a state where a substrate with no warpage is mounted on the electrostatic chuck.
Figure 9B:
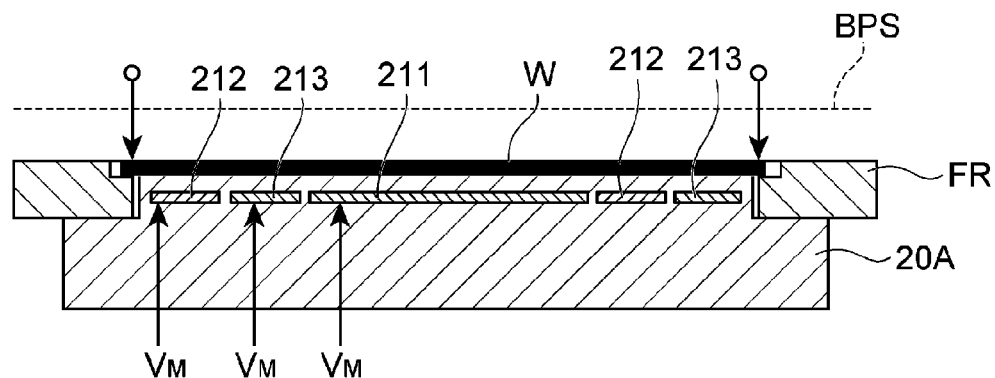
FIGS. 9B and 9C are cross-sectional views illustrating an example of a state where the substrate illustrated in FIG. 9A is held by the electrostatic chuck.
Figure 9C:
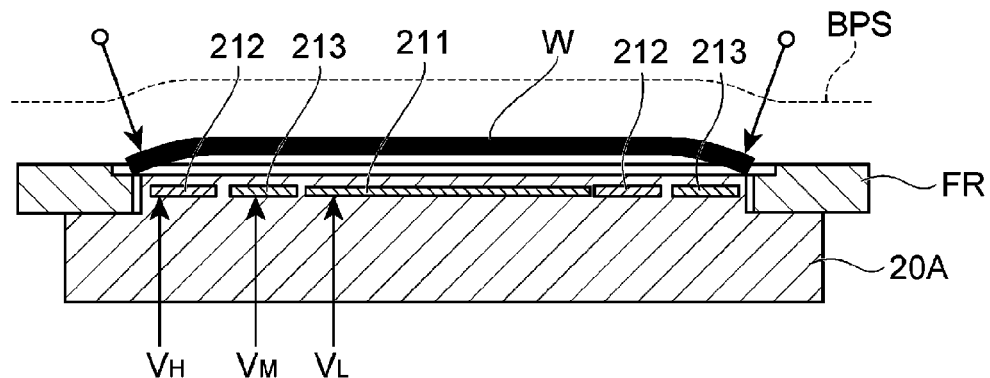
Figure 10A:
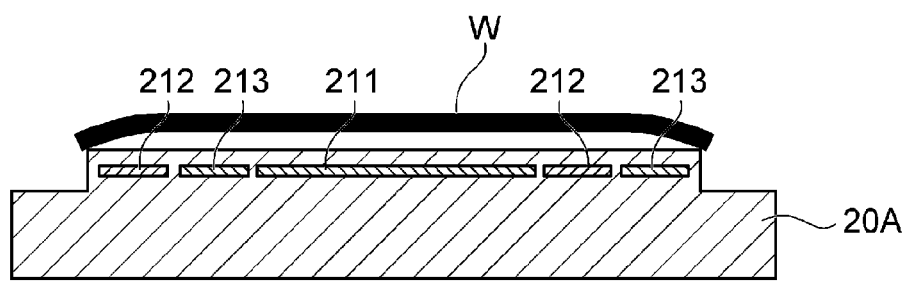
FIG. 10A is a cross-sectional view illustrating an example of a state where a substrate with a convex warpage is mounted on the electrostatic chuck.
Figure 10B:
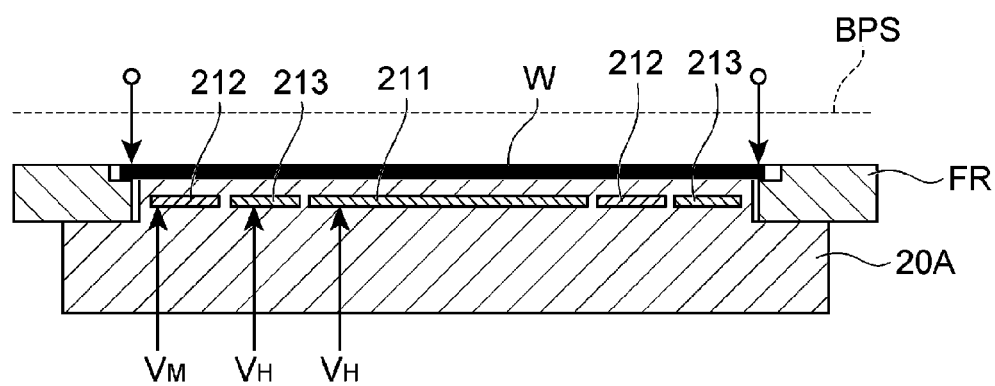
FIGS. 10B and 10C are cross-sectional views illustrating an example of a state where the substrate illustrated in FIG. 10A is held by the electrostatic chuck.
Figure 10C:
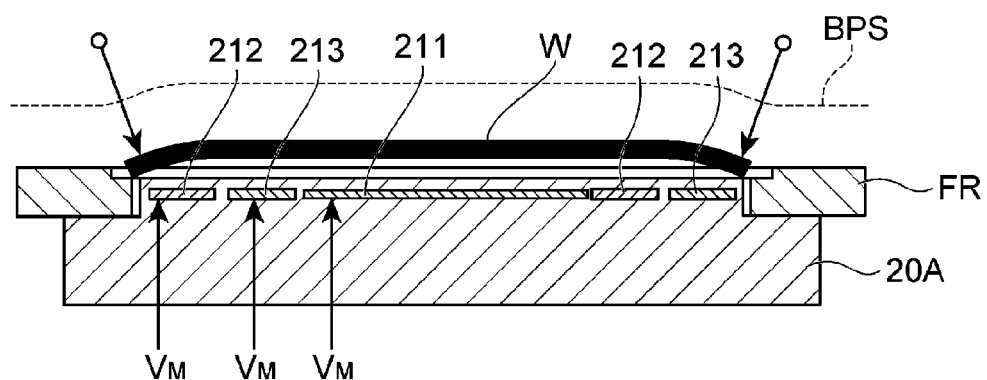
Figure 11A:
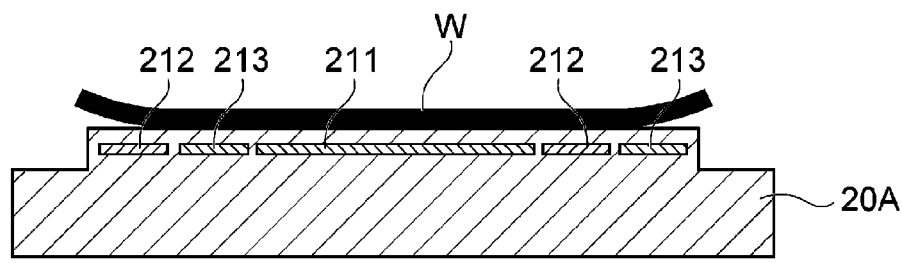
FIG. 11A is a cross-sectional view illustrating an example of a state where a substrate with a recessed warpage is mounted on the electrostatic chuck.
Figure 11B:
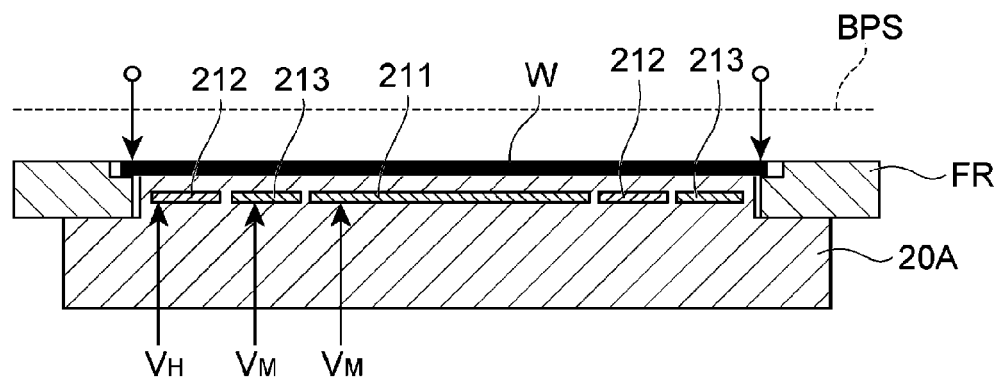
FIGS. 11B and 11C are cross-sectional views illustrating an example of a state where the substrate illustrated in FIG. 11A is held by an electrostatic chuck.
Figure 11C:
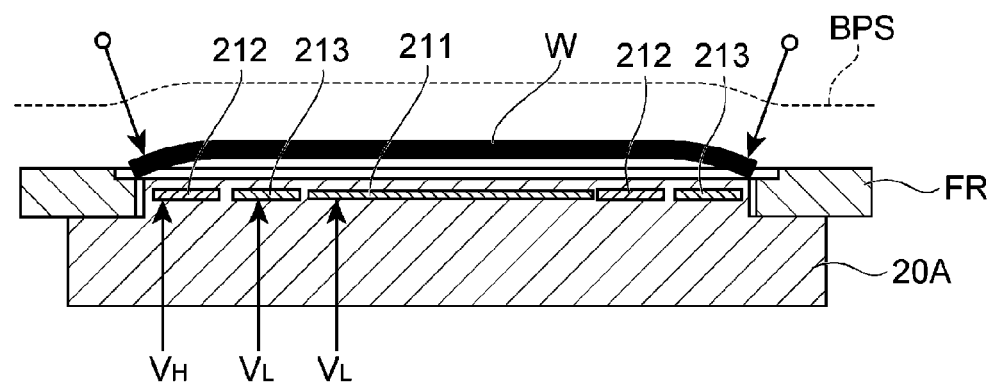

The plurality of voltages $V_{ESC}$ determined at step ST4 of the method MT when the electrostatic chuck 20A illustrated in FIG. 8 is used will be described hereinbelow. In the following description, reference will be made to FIG. 9A, FIG. 9B, FIG. 9C, FIG. 10A, FIG. 10B, FIG. 10C, FIG. 11A, FIG. 11B, and FIG. 11C. FIG. 9A is a cross-sectional view illustrating an example of a state where a substrate with no warpage is mounted on the electrostatic chuck. FIGS. 9B and 9C are cross-sectional views illustrating an example of a state where the substrate illustrated in FIG. 9A is held by the electrostatic chuck. FIG. 10A is a cross-sectional view illustrating an example of a state where a substrate with a convex warpage is mounted on the electrostatic chuck. FIGS. 10B and 10C are cross-sectional views illustrating an example of a state where the substrate illustrated in FIG. 10A is held by the electrostatic chuck. FIG. 11A is a cross-sectional view illustrating an example of a state where a substrate with a recessed warpage is mounted on the electrostatic chuck. FIGS. 11B and 11C are cross-sectional views illustrating an example of a state where the substrate illustrated in FIG. 11A is held by the electrostatic chuck.

FIGS. 9B, 10B, and 11B illustrate a case where the focus ring FR is in an initial state or a case where the focus ring FR is exposed to plasma for a short integration time. When the focus ring FR is in an initial state or when the focus ring FR is exposed to plasma for a short integration time, the focus ring FR is not substantially consumed, and thus has a relatively large thickness. FIGS. 9C, 10C, and 11C illustrate a case where the focus ring FR is consumed. When the focus ring FR is consumed, the thickness of the focus ring FR is small.

When the substrate W with no warpage is arranged in the region surrounded by the focus ring FR which is not substantially consumed, the voltages respectively applied to the first electrode 211, the second electrode 212 and the third electrode 213 are the same $V_M$, as illustrated in FIG. 9B. When the substrate W with a convex warpage is arranged in the region surrounded by the focus ring FR which is not substantially consumed, the voltages respectively applied to the first electrode 211, the third electrode 213 and the second electrode 212 are $V_H$, $V_H$, and $V_M$, as illustrated in FIG. 10B. As a result, the substrate W is held by the electrostatic chuck 20 while it is deformed from the shape illustrated in FIG. 10A to the shape illustrated in FIG. 10B, i.e., the shape with no warpage. When the substrate W with a recessed warpage is arranged in the region surrounded by the focus ring FR which is not substantially consumed, the voltages respectively applied to the first electrode 211, the third electrode 213 and the second electrode 212 are $V_M$, $V_M$, and $V_H$, as illustrated in FIG. 11B. As a result, the substrate W is held by the electrostatic chuck 20 while it is deformed from the shape illustrated in FIG. 11A to the shape illustrated in FIG. 11B, i.e., the shape with no warpage. Furthermore, $V_H$ and $V_M$ have a relationship of $V_H > V_M$.

When the substrate W with no warpage is arranged in the region surrounded by the focus ring FR which is consumed, the voltages respectively applied to the first electrode 211, the third electrode 213 and the second electrode 212 are $V_L$, $V_M$, and $V_H$, as illustrated in FIG. 9C. As a result, the substrate W is held by the electrostatic chuck 20 while it is deformed from the shape illustrated in FIG. 9A to the shape illustrated in FIG. 9C, i.e., the convex shape. When the substrate W with a convex warpage is arranged in the region surrounded by the focus ring FR which is consumed, the voltages respectively applied to the first electrode 211, the second electrode 212 and the third electrodes 213 are the same $V_M$, as illustrated in FIG. 10C. When the substrate W with a recessed warpage is arranged in the region surrounded by the focus ring FR which is consumed, the voltages respectively applied to the first electrode 211, the third electrode 213 and the second electrode 212 are $V_L$, $V_L$, and $V_H$, as illustrated in FIG. 11C. As a result, the substrate W is held by the electrostatic chuck 20 while it is deformed from the shape illustrated in FIG. 11A to the shape illustrated in FIG. 11C, i.e., the convex shape. Furthermore, $V_H$, $V_M$, and $V_L$ have a relationship of $V_H > V_M > V_L$.

Yet another electrostatic chuck that can be adopted in the plasma processing device 1 will be described hereinbelow. In yet another embodiment, the substrate mounting region 20w of the electrostatic chuck of the plasma processing device 1 has one or more regions, in addition to the first region 201 and the second region 202. The one or more regions extend in the circumferential direction between the first region 201 and the second region 202. A plurality of electrodes is installed in each of the plurality of regions of the substrate mounting region 20w including the first region 201, the second region 202, and the one or more regions. In each of the plurality of regions of the substrate mounting region 20w, the plurality of electrodes is arranged along the circumferential direction. The individually adjusted DC voltages are applied to the plurality of electrodes of the electrostatic chuck of the present embodiment from the one or more DC power sources 24.

Figure 12:
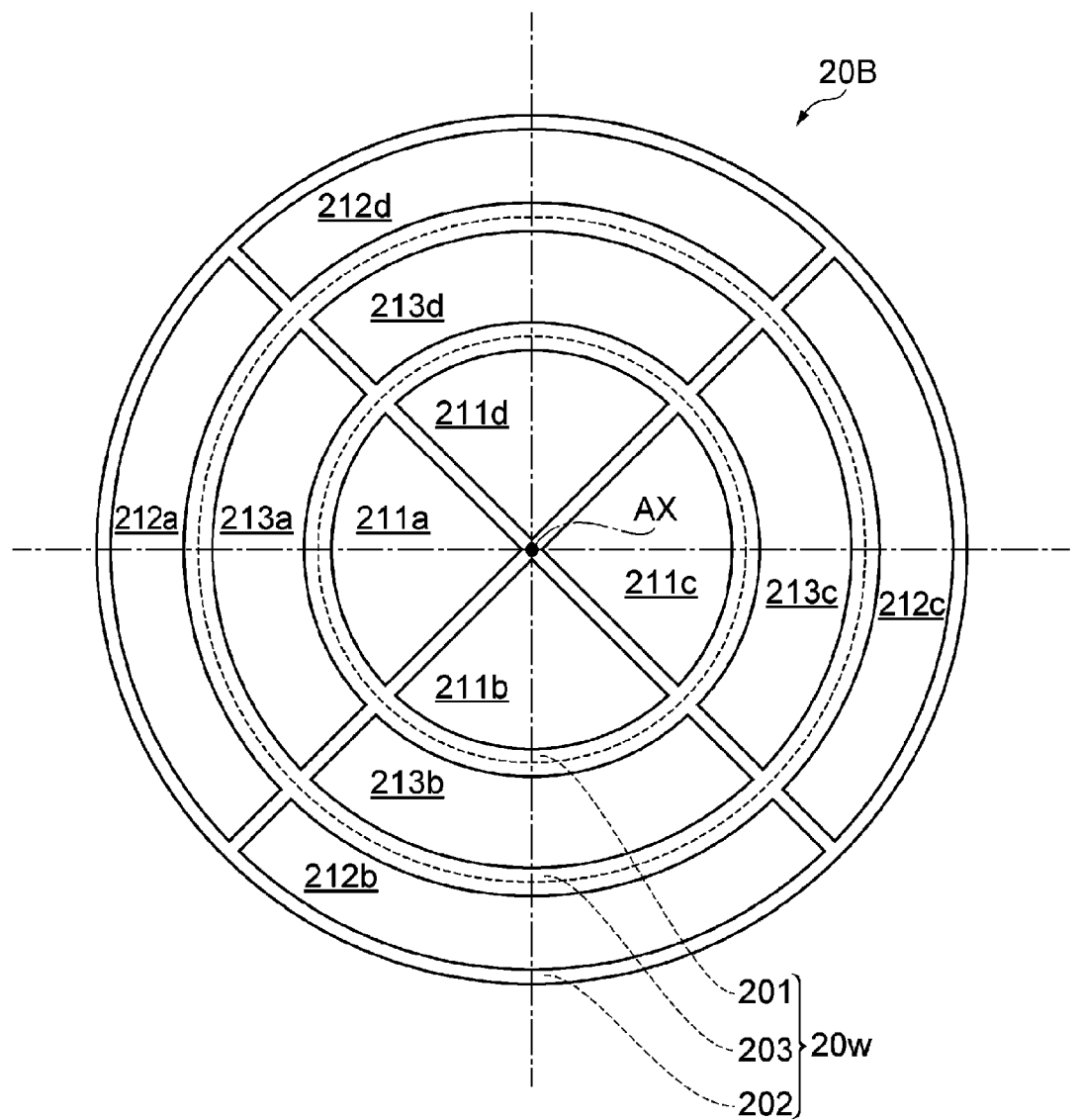
FIG. 12 is a diagram schematically illustrating a configuration of a part of an electrostatic chuck of a plasma processing device according to yet another exemplary embodiment of the present disclosure in a cross section.
Figure 12:
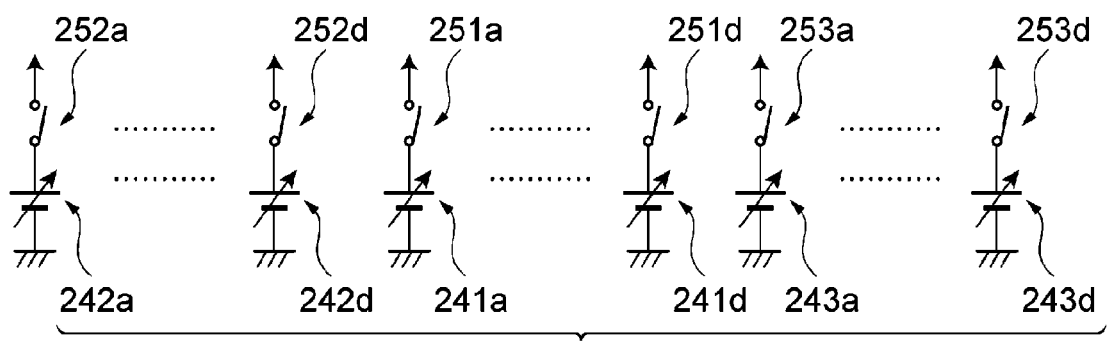

FIG. 12 is a diagram schematically illustrating a configuration of an electrostatic chuck of a plasma processing device according to yet another exemplary embodiment of the present disclosure in a partial cross section. Instead of the electrostatic chuck 20, an electrostatic chuck 20B illustrated in FIG. 12 may be adopted as the electrostatic chuck of the plasma processing device 1. In the electrostatic chuck 20B, the substrate mounting region 20w has a third region 203, in addition to the first region 201 and the second region 202. The third region 203 extends in the circumferential direction between the first region 201 and the second region 202. The electrostatic chuck 20B has a plurality of electrodes. The plurality of electrodes of the electrostatic chuck 20B includes four first electrodes 211a, 211b, 211c and 211d, four second electrodes 212a, 212b, 212c and 212d, and four third electrodes 213a, 213b, 213c and 213d. The first electrodes 211a, 211b, 211c, and 211d are installed in the first region 201 and are arranged along the circumferential direction. The second electrodes 212a, 212b, 212c, and 212d are installed in the second region 202 and are arranged along the circumferential direction. The third electrodes 213a, 213b, 213c, and 213d are installed in the third region 203 and are arranged along the circumferential direction. In addition, the number of the plurality of electrodes installed in each of the plurality of regions of the substrate mounting region 20w may be any number.

The individually adjusted DC voltages are applied to the plurality of electrodes of the electrostatic chuck 20B from the one or more DC power sources 24. In one embodiment, the one or more DC power sources 24 include four DC power sources 241a to 241d, four DC power sources 242a to 242d, and four DC power sources 243a to 243d. The four DC power sources 241a to 241d are coupled to the four first electrodes 211a to 211d via four switches 251a to 251d, respectively. The four DC power sources 242a to 242d are coupled to the four second electrodes 212a to 212d via four switches 252a to 252d, respectively. The four DC power sources 243a to 243d are coupled to the four third electrodes 213a to 213d via four switches 253a to 253d, respectively.

Similar to the electrostatic chuck 20 and the electrostatic chuck 20A, the electrostatic chuck according to yet another embodiment, such as the electrostatic chuck 20B, can adjust the shape of the substrate. In the electrostatic chuck according to yet another embodiment such as the electrostatic chuck 20B, in order to adjust the shape of the substrate as in the electrostatic chuck 20 and the electrostatic chuck 20A, the same voltage is applied to the plurality of electrodes included in each region of the substrate mounting region 20w. Furthermore, the electrostatic chuck according to yet another embodiment, such as the electrostatic chuck 20B, can adjust the shape of the substrate W with a semi-cylindrical warpage or a saddle-shaped warpage.

The plurality of voltages $V_{ESC}$ determined at step ST4 of the method MT when the electrostatic chuck 20B illustrated in FIG. 12 is used will be described hereinbelow. In the following description, the terms "X", "Y", and "Z" are used as the terms indicating the direction. The Z direction is the vertical direction. The X direction is one direction parallel to the horizontal plane. The Y direction is another direction parallel to the horizontal plane and is a direction orthogonal to the X direction.

Figure 13A:
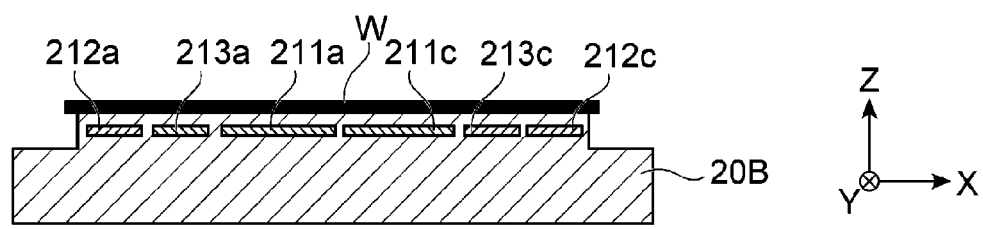
FIGS. 13A and 13B are cross-sectional views illustrating an example of a state where a substrate with a semi-cylindrical warpage is mounted on the electrostatic chuck.
Figure 13B:
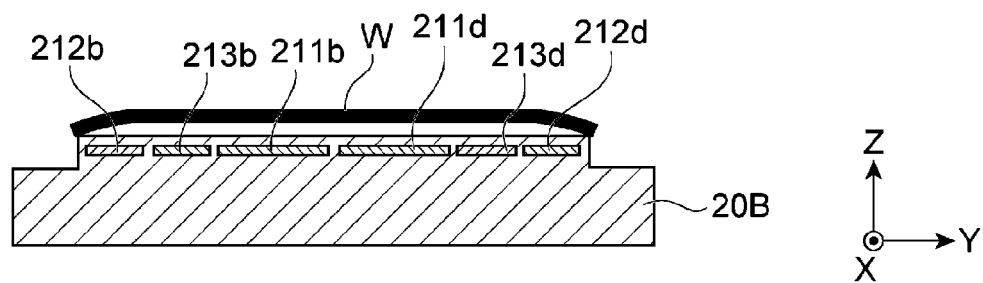
Figure 13C:
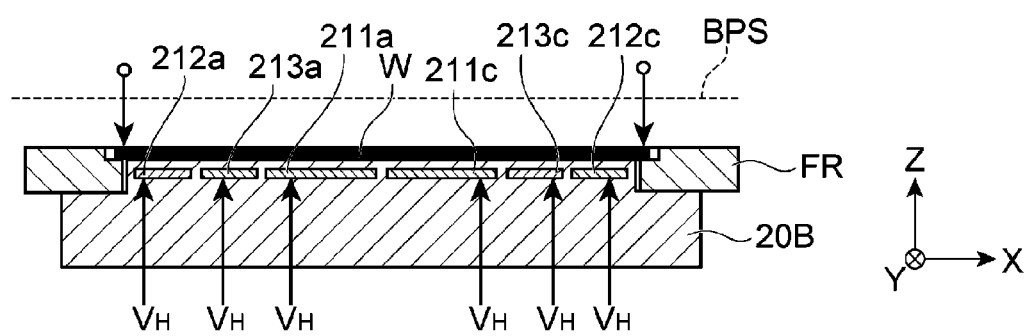
FIGS. 13C and 13D are cross-sectional views illustrating an example of a state where the substrate is held by the electrostatic chuck.
Figure 13D:
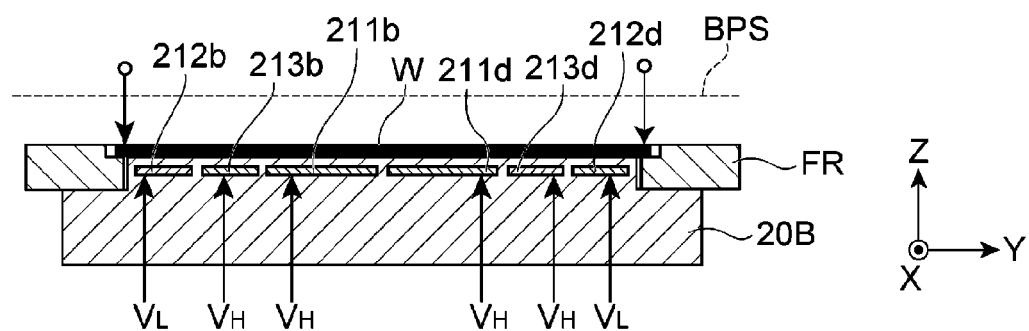
Figure 14A:
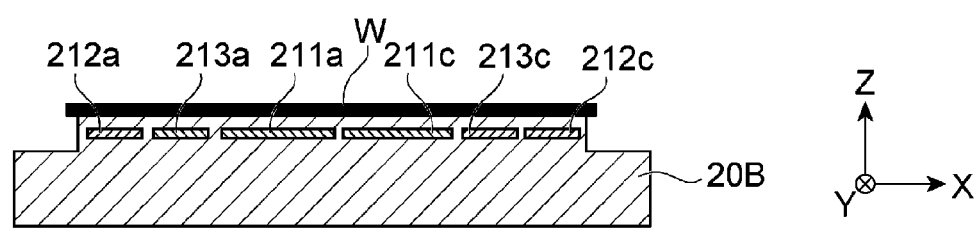
FIGS. 14A and 14B are cross-sectional views illustrating an example of a state where a substrate with a semi-cylindrical warpage is mounted on the electrostatic chuck.
Figure 14B:
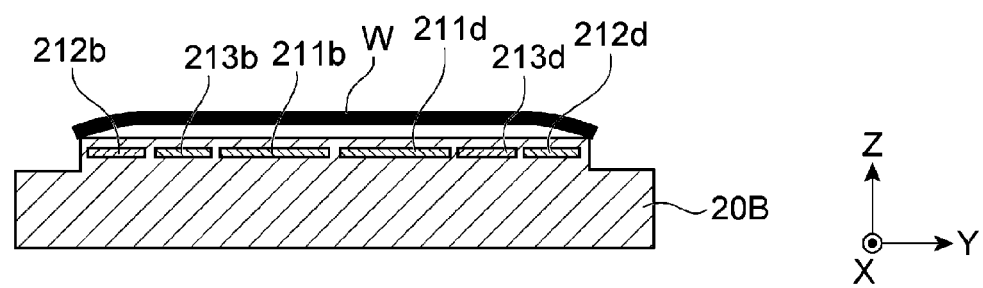
Figure 14C:
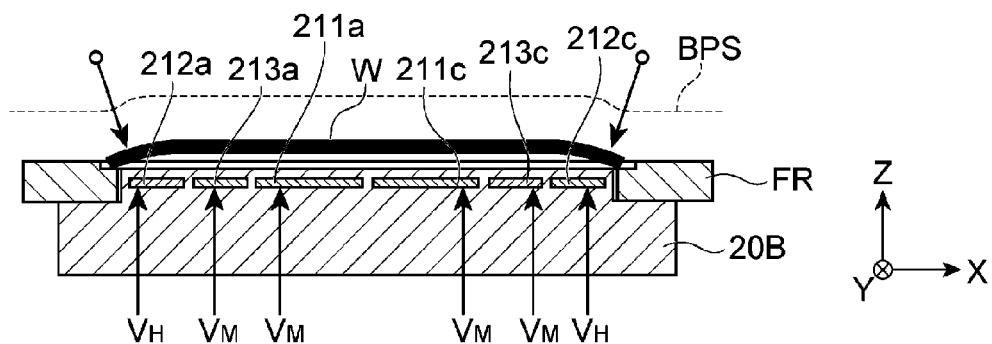
FIGS. 14C and 14D are cross-sectional views illustrating an example of a state where the substrate is held by the electrostatic chuck.
Figure 14D:
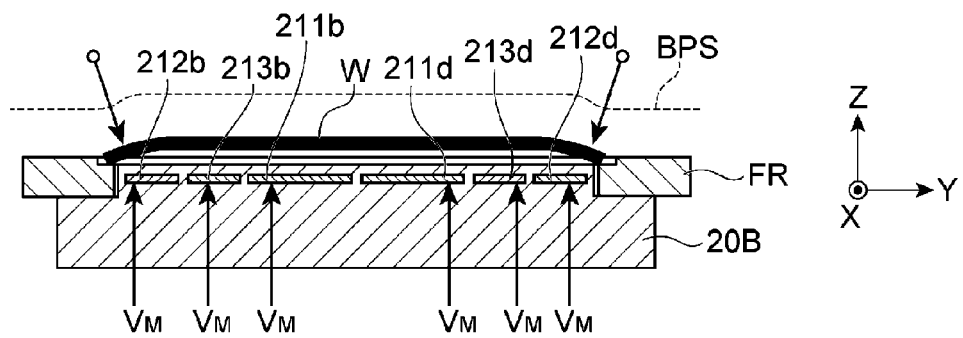
Figure 15A:
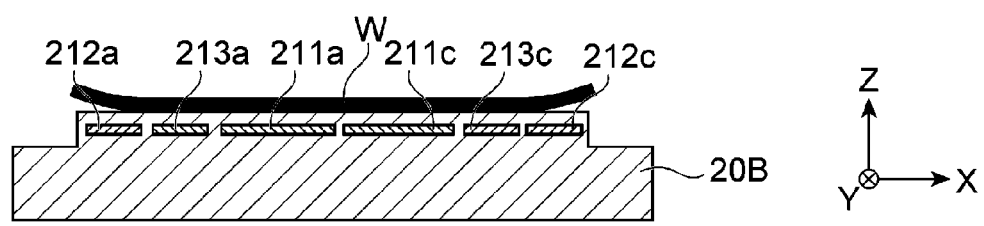
FIGS. 15A and 15B are cross-sectional views illustrating an example of a state where a substrate with a saddle-shaped warpage is mounted on the electrostatic chuck.
Figure 15B:
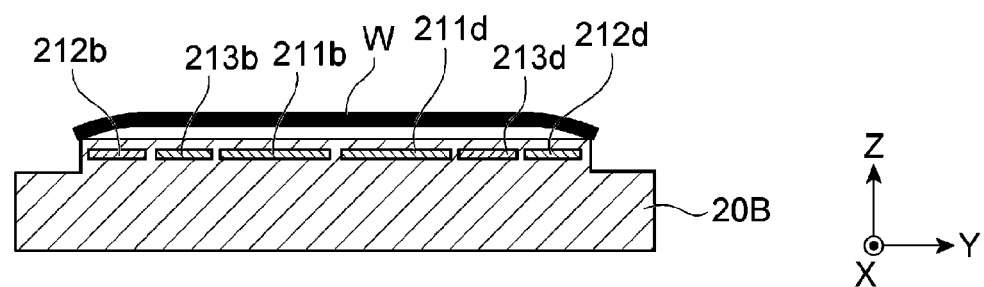
Figure 15C:
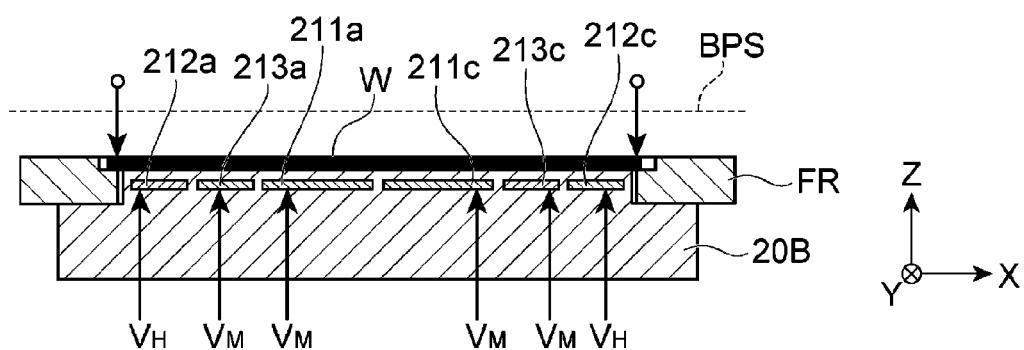
FIGS. 15C and 15D are cross-sectional views illustrating an example of a state where the substrate is held by the electrostatic chuck.
Figure 15D:
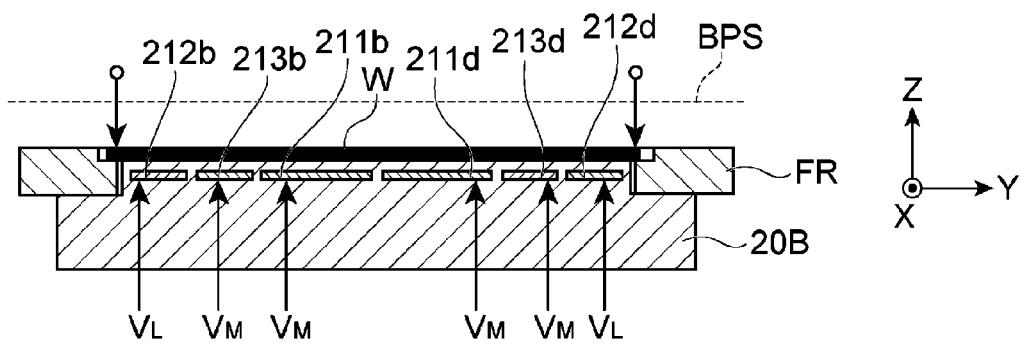
Figure 16A:
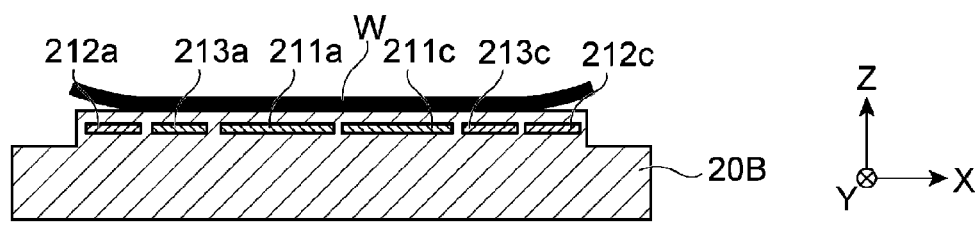
FIGS. 16A and 16B are cross-sectional views illustrating an example of a state where a substrate with a saddle-shaped warpage is mounted on the electrostatic chuck.
Figure 16B:
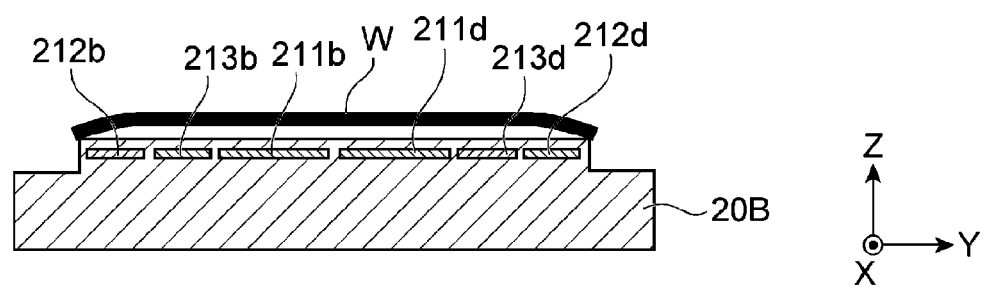

In the following description, reference will be made to FIG. 13A, FIG. 13B, FIG. 13C, FIG. 13D, FIG. 14A, FIG. 14B, FIG. 14C, and FIG. 14D. In addition, reference will be made to FIG. 15A, FIG. 15B, FIG. 15C, FIG. 15D, FIG. 16A, FIG. 16B, FIG. 16C, and FIG. 16D. FIGS. 13A and 13B are cross-sectional views illustrating an example of a state where a substrate with a semi-cylindrical warpage is mounted on the electrostatic chuck, and FIGS. 13C and 13D are cross-sectional views illustrating an example of a state where the substrate is held by the electrostatic chuck. FIGS. 14A and 14B are cross-sectional views illustrating an example of a state in which a substrate with a semi-cylindrical warpage is mounted on the electrostatic chuck, and FIGS. 14C and 14D are cross-sectional views illustrating an example of a state where the substrate is held by the electrostatic chuck. FIGS. 15A and 15B are cross-sectional views illustrating an example of a state where a substrate with a saddle-shaped warpage is mounted on the electrostatic chuck, and FIGS. 15C and 15D are cross-sectional views illustrating an example of a state where the substrate is held by the electrostatic chuck. FIGS. 16A and 16B are cross-sectional views illustrating an example of a state where a substrate with a saddle-shaped warpage is mounted on the electrostatic chuck, and FIGS. 16C and 16D cross-sectional views illustrating an example of a state where the substrate is held by the electrostatic chuck.

The XZ cross section of the substrate W is illustrated in each of FIGS. 13A, 14A, 15A, and 16A. The YZ cross section of the substrate W is illustrated in each of FIGS. 13B, 14B, 15B, and 16B. As illustrated in FIGS. 13A and 13B, or FIGS. 14A and 14B, the substrate W with a semi-cylindrical warpage has a convex shape in an arbitrary cross section orthogonal to one direction (X direction in the drawing). The substrate W with a semi-cylindrical warpage has a flat shape in an arbitrary cross section orthogonal to a direction (Y direction in the drawing) orthogonal to the one direction. As illustrated in FIGS. 15A and 15B, or FIGS. 16A and 16B, the substrate W with a saddle-shaped warpage has a convex shape in an arbitrary cross section orthogonal to one direction (X direction in the drawing). The substrate W with a saddle-shaped warpage has a recess shape in an arbitrary cross section orthogonal to a direction (Y direction in the drawing) orthogonal to the one direction.

FIGS. 13C, 13D, 15C, and 15D illustrate a case where the focus ring FR is in an initial state or a case where the focus ring FR is exposed to plasma for a short integration time. When the focus ring FR is in an initial state or when the focus ring FR is exposed to plasma for a short integration time, the focus ring FR is not substantially consumed, and thus has a relatively large thickness. FIGS. 14C, 14D, 16C, and 16D illustrate a case where the focus ring FR is consumed. When the focus ring FR is consumed, the thickness of the focus ring FR is small.

In the following description, it is assumed that the second electrode 212a, the third electrode 213a, the first electrode 211a, the first electrode 211c, the third electrode 213c, and the second electrode 212c are arranged along the X direction. In addition, it is assumed that the second electrode 212b, the third electrode 213b, the first electrode 211b, the first electrode 211d, the third electrode 213d, and the second electrode 212d are arranged along the Y direction.

FIGS. 13C and 13D illustrate a plurality of voltages respectively applied to the plurality of electrodes of the electrostatic chuck 20B when the substrate with a semi-cylindrical warpage is arranged in the region surrounded by the focus ring FR which is not substantially consumed. Specifically, the voltages respectively applied to the second electrode 212a, the third electrode 213a, the first electrode 211a, the first electrode 211c, the third electrode 213c, and the second electrode 212c are the same $V_H$, as illustrated in FIG. 13C. Furthermore, the voltages respectively applied to the second electrode 212b, the third electrode 213b, the first electrode 211b, the first electrode 211d, the third electrode 213d, and the second electrode 212d are $V_L$, $V_H$, $V_H$, $V_H$, $V_H$, and $V_L$, as illustrated in FIG. 13D. As a result, the substrate W is held by the electrostatic chuck 20 while it is deformed from the shape with a semi-cylindrical warpage to the shape with no warpage, as illustrated in FIGS. 13C and 13D. Furthermore, $V_H$ and $V_L$ have a relationship of $V_H \gg V_L$.

FIGS. 14C and 14D illustrate a plurality of voltages respectively applied to the plurality of electrodes of the electrostatic chuck 20B when the substrate with a semi-cylindrical warpage is arranged in the region surrounded by the focus ring FR which is substantially consumed. Specifically, the voltages respectively applied to the second electrode 212a, the third electrode 213a, the first electrode 211a, the first electrode 211c, the third electrode 213c, and the second electrode 212c are $V_H$, $V_M$, $V_M$, $V_M$, $V_M$, and $V_H$, as illustrated in FIG. 14C. In addition, the voltages respectively applied to the second electrode 212b, the third electrode 213b, the first electrode 211b, the first electrode 211d, the third electrode 213d, and the second electrode 212d are the same $V_M$, as illustrated in FIG. 14D. As a result, the substrate W is held by the electrostatic chuck 20 while it is deformed from the shape with a semi-cylindrical warpage to the shape illustrated in FIGS. 14C and 14D, i.e., the convex shape. Furthermore, $V_H$ and $V_M$ have a relationship of $V_H > V_M$.

FIGS. 15C and 15D illustrates a plurality of voltages respectively applied to the plurality of electrodes of the electrostatic chuck 20B when the substrate with a saddle-shaped warpage is arranged in the region surrounded by the focus ring FR which is not substantially consumed. Specifically, the voltages respectively applied to the second electrode 212a, the third electrode 213a, the first electrode 211a, the first electrode 211c, the third electrode 213c, and the second electrode 212c are $V_H$, $V_M$, $V_M$, $V_M$, $V_M$, and $V_H$, as illustrated in FIG. 15C. In addition, the voltages respectively applied to the second electrode 212b, the third electrode 213b, the first electrode 211b, the first electrode 211d, the third electrode 213d, and the second electrode 212d are $V_L$, $V_M$, $V_M$, $V_M$, $V_M$, and $V_L$, as illustrated in FIG. 15D. As a result, the substrate W is held by the electrostatic chuck 20 while it is deformed from the shape along the saddle shape to the shape with no warpage, as illustrated in FIGS. 15C and 15D. Furthermore, $V_H$, $V_M$, and $V_L$ have a relationship of $V_H > V_M > V_L$.

Figure 16C:
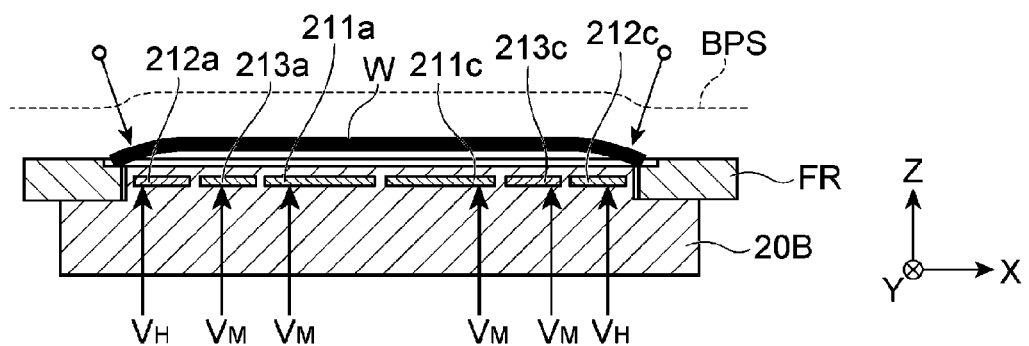
FIGS. 16C and 16D are cross-sectional views illustrating an example of a state where the substrate is held by the electrostatic chuck.
Figure 16D:
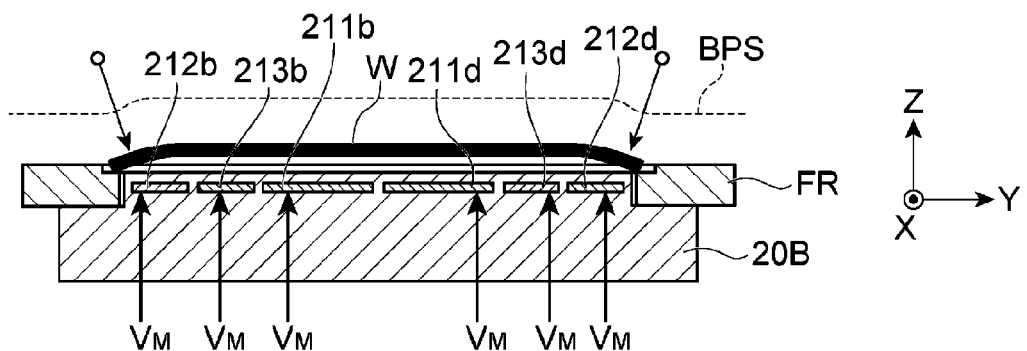

FIGS. 16C and 16D illustrate a plurality of voltages respectively applied to the plurality of electrostatic chucks 20B when the substrate with a saddle-shaped warpage is arranged in the region surrounded by the focus ring FR which is consumed. Specifically, the voltages respectively applied to the second electrode 212a, the third electrode 213a, the first electrode 211a, the first electrode 211c, the third electrode 213c, and the second electrode 212c are $V_H$, $V_M$, $V_M$, $V_M$, $V_M$, and $V_H$, as illustrated in FIG. 16C. In addition, the voltages respectively applied to the second electrode 212b, the third electrode 213b, the first electrode 211b, the first electrode 211d, the third electrode 213d, and the second electrode 212d are the same $V_M$, as illustrated in FIG. 16D. As a result, the substrate W is held by the electrostatic chuck 20 while it is deformed from the shape with a saddle-shaped warpage to the shape illustrated in FIGS. 16C and 16D, i.e., the convex shape. Furthermore, $V_H$ and $V_M$ have a relationship of $V_H > V_M$.

Although various exemplary embodiments have been described above, the present disclosure is not limited to the aforementioned exemplary embodiments but various omissions, substitutions, and modifications may be made. In addition, other embodiments may be formed by combining elements in other embodiments.

In other embodiments, the plasma processing device may be a plasma processing device of a type other than the capacitive coupling type. As any other type of plasma processing device, an inductively coupled plasma processing device or a plasma processing device which generates plasma using surface waves such as microwaves is exemplified.

Figure 17:
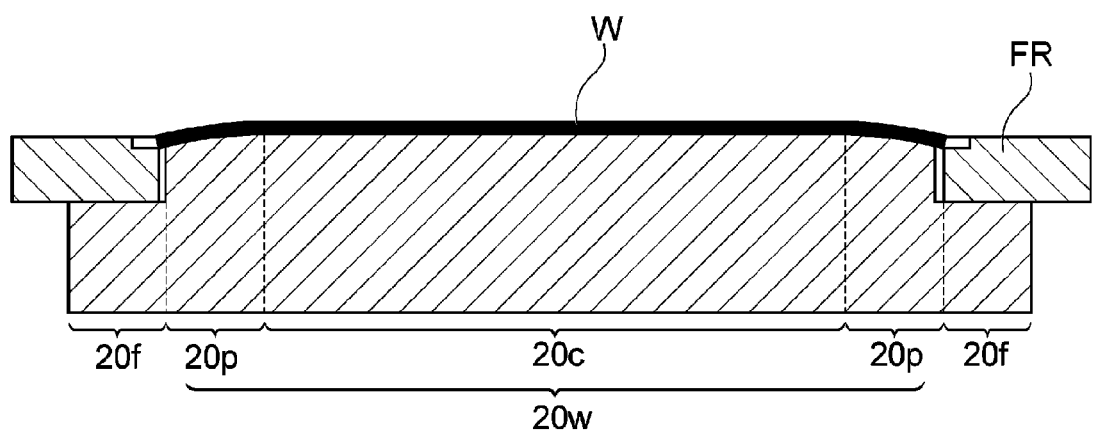
FIG. 17 is a vertical cross-sectional view illustrating an electrostatic chuck of a plasma processing device according to yet another exemplary embodiment of the present disclosure.

FIG. 17 is a vertical cross-sectional view illustrating an electrostatic chuck of a plasma processing device according to yet another exemplary embodiment of the present disclosure. As illustrated in FIG. 17, the upper surface of the substrate mounting region 20w may extend along a convex surface. In addition, the upper surface of the substrate mounting region 20w may be substantially flat in a central region 20c of the substrate mounting region 20w, and may be formed so that the position in the height direction of an outer peripheral region 20p of the substrate mounting region 20w is lowered according to a distance from the central axis of the substrate mounting region 20w. Furthermore, the outer peripheral region 20p of the substrate mounting region 20w may have a distance of 135 mm or more from the central axis of the substrate mounting region 20w.

While certain embodiments have been described, these embodiments have been served to explain the present disclosure, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

EXPLANATION OF REFERENCE NUMERALS

1: plasma processing device, 10: chamber, 16: support table, 18: lower electrode, 20: electrostatic chuck, 211: first electrode, 212: second electrode, 24: DC power source, MC: controller, FR: focus ring, W: substrate, WC: central region, WE: edge region.

What is claimed is:

1. A plasma etching method, the method comprising:
   mounting a substrate on a substrate support of a plasma processing device,
      wherein the substrate support has a lower electrode and an electrostatic chuck installed on the lower electrode, the substrate support being installed in a chamber of the plasma processing device, and the substrate is arranged on the electrostatic chuck and in a region surrounded by a focus ring;
   determining a plurality of voltages respectively applied to a plurality of electrodes of the electrostatic chuck,
      wherein the plurality of electrodes includes a first electrode extending below a central region of the substrate and a second electrode extending below an edge region of the substrate, and the plurality of voltages are determined such that ions from plasma are substantially vertically incident on both the central region and the edge region while the substrate is held by the electrostatic chuck; and
   etching the substrate with the ions from the plasma generated in the chamber while the plurality of voltages is respectively applied to the plurality of electrodes,
   wherein the step of determining the plurality of voltages includes:
   determining the plurality of voltages respectively applied to the plurality of electrodes such that a position of an upper surface of the edge region in a height direction becomes lowered according to an increase of a distance from a central axis of the substrate when the ions are incident on the edge region along a direction inclined toward the central axis; and
   determining the plurality of voltages such that the upper surface of the edge region becomes horizontal when the ions are incident on the edge region along a vertical direction.

2. The method of claim 1, wherein the plurality of voltages is determined to correct an angle of an opening formed in a test substrate by plasma etching on the test substrate in the chamber.

3. The method of claim 1, wherein the substrate is deformed by independently applying the plurality of voltages to the plurality of electrodes.

4. The method of claim 1, wherein in a region, which is in the electrostatic chuck and includes the second electrode, an upper surface of the electrostatic chuck is formed such that a position of the electrostatic chuck in a height direction is lowered according to an increase of a distance from a center of the electrostatic chuck in a radial direction.

5. The method of claim 1, wherein at least a portion of the second electrode is arranged to overlap with the substrate when viewed from top of the substrate.

6. The method of claim 1, wherein the plurality of voltages is determined using a relationship between the plurality of voltages respectively applied to the plurality of electrodes and a set of a first parameter indicating a state of the focus ring and a second parameter indicating a state of warpage of the substrate.

7. The method of claim 6, wherein the second parameter is acquired by optical or electrical measurement of the substrate before the substrate is held by the electrostatic chuck.

8. The method of claim 6, wherein the first parameter is one of a thickness of the focus ring, a position of an upper surface of the focus ring in a height direction, or an integration time during which the focus ring is exposed to the plasma in the chamber.

9. The method of claim 8, wherein the second parameter is acquired by optical or electrical measurement of the substrate before the substrate is held by the electrostatic chuck.

10. The method of claim 9, wherein the substrate is deformed by independently applying the plurality of voltages to the plurality of electrodes.

11. The method of claim 10, wherein in a region, which is in the electrostatic chuck and includes the second electrode, an upper surface of the electrostatic chuck is formed such that a position of the electrostatic chuck in a height direction is lowered according to an increase of a distance from a center of the electrostatic chuck in a radial direction.

12. A plasma processing device, the device comprising:
   a chamber;
   a substrate support having a lower electrode and an electrostatic chuck installed on the lower electrode, the substrate support being installed in the chamber;
      wherein the electrostatic chuck has a plurality of electrodes, the plurality of electrodes including a first electrode and a second electrode, wherein the first electrode extends below a central region of a substrate arranged on the electrostatic chuck and in a region surrounded by a focus ring, and the second electrode extends below an edge region of the substrate;
   a radio-frequency power source coupled to the lower electrode;
   one or more DC power sources configured to apply a plurality of individually adjusted voltages to the plurality of electrodes; and
   a controller configured to control the one or more DC power sources so as to determine the plurality of voltages such that ions from plasma are substantially vertically incident on both the central region and the edge region while the substrate is held by the electrostatic chuck and to apply the plurality of determined voltages to the plurality of electrodes,
   wherein the controller is further configured to determine the plurality of voltages using a relationship between the plurality of voltages respectively applied to the plurality of electrodes and a set of parameters, the set of parameters including a first parameter and a second parameter, the first parameter indicating a state of the focus ring, and the second parameter indicating a state of warpage of the substrate.

13. The device of claim 12, wherein the first parameter is a thickness of the focus ring, a position of an upper surface of the focus ring in a height direction, or an integration time during which the focus ring is exposed to the plasma in the chamber.

14. The device of claim 12, wherein the controller is configured to determine the plurality of voltages by using the second parameter achieved by optical or electrical measurement of the substrate before the substrate is held by the electrostatic chuck.

15. The device of claim 12, wherein the controller is configured to:
  determine the plurality of voltages respectively applied to the plurality of electrodes such that a position of an upper surface of the edge region in a height direction becomes lowered according to an increase of a distance from a central axis when the ions are incident on the edge region along a direction inclined toward the central axis of the substrate; and
  determine the plurality of voltages such that the upper surface of the edge region becomes horizontal when the ions are incident on the edge region along a vertical direction.

16. The device of claim 12, wherein the controller is configured to determine the plurality of voltages so as to deform the substrate.

17. The device of claim 12, wherein in a region, which is in the electrostatic chuck and includes the second electrode, an upper surface of the electrostatic chuck is formed such that a position of the electrostatic chuck in a height direction is lowered according to an increase of a distance from a center of the electrostatic chuck in a radial direction.

18. The device of claim 12, wherein at least a portion of the second electrode is arranged to overlap with the substrate when viewed from top of the substrate.

19. A plasma processing device, the device comprising:
  a chamber;
  a substrate support having a lower electrode and an electrostatic chuck installed on the lower electrode, the substrate support being installed in the chamber;
    wherein the electrostatic chuck has a plurality of electrodes, the plurality of electrodes including a first electrode and a second electrode, wherein the first electrode extends below a central region of a substrate arranged on the electrostatic chuck and in a region surrounded by a focus ring, and the second electrode extends below an edge region of the substrate;
  a radio-frequency power source coupled to the lower electrode;
  one or more DC power sources configured to apply a plurality of individually adjusted voltages to the plurality of electrodes; and
  a controller configured to control the one or more DC power sources so as to determine the plurality of voltages such that ions from plasma are substantially vertically incident on both the central region and the edge region while the substrate is held by the electrostatic chuck and to apply the plurality of determined voltages to the plurality of electrodes,
  wherein the plurality of voltages is determined in advance so as to correct an angle of an opening formed in a test substrate by plasma etching on the test substrate in the chamber.

* * * * *